(12) United States Patent
Sugimoto et al.

(10) Patent No.: US 9,165,923 B2
(45) Date of Patent: Oct. 20, 2015

(54) SEMICONDUCTOR DEVICE HAVING PLURAL STANDARD CELLS

(71) Applicant: PS4 Luxco S.a.r.l., Luxembourg (LU)

(72) Inventors: Satoru Sugimoto, Tokyo (JP); Takanari Shimizu, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/786,017

(22) Filed: Mar. 5, 2013

(65) Prior Publication Data

US 2013/0228877 A1  Sep. 5, 2013

(30) Foreign Application Priority Data

Mar. 5, 2012  (JP) ................... 2012-047834

(51) Int. Cl.
*H01L 27/088* (2006.01)
*H01L 27/02* (2006.01)
*H01L 27/118* (2006.01)

(52) U.S. Cl.
CPC .......... *H01L 27/088* (2013.01); *H01L 27/0207* (2013.01); *H01L 27/11807* (2013.01); *H01L 2027/11881* (2013.01)

(58) Field of Classification Search
CPC ..................................................... H01L 27/088
USPC ........................................................ 257/401
See application file for complete search history.

(56) References Cited

U.S. PATENT DOCUMENTS

| | | | |
|---|---|---|---|
| 5,384,738 A * | 1/1995 | Miyaoka et al. | 365/189.08 |
| 5,532,501 A * | 7/1996 | Nakamura | 257/208 |
| 6,274,895 B1 | 8/2001 | Fujii et al. | |
| 6,521,926 B1 * | 2/2003 | Sasaki | 257/292 |
| 6,707,139 B2 | 3/2004 | Fujii et al. | |
| 8,178,905 B2 | 5/2012 | Toubou | |
| 2002/0030212 A1 * | 3/2002 | Fujii et al. | 257/296 |
| 2007/0241810 A1 * | 10/2007 | Onda | 327/544 |
| 2007/0278528 A1 * | 12/2007 | Ato et al. | 257/207 |
| 2008/0159048 A1 * | 7/2008 | Matano | 365/227 |
| 2008/0169487 A1 * | 7/2008 | Shimbo et al. | 257/207 |
| 2008/0169868 A1 | 7/2008 | Toubou | |
| 2008/0246091 A1 * | 10/2008 | Kondo et al. | 257/369 |
| 2010/0097875 A1 * | 4/2010 | Vinke et al. | 365/226 |
| 2010/0133589 A1 | 6/2010 | Aruga et al. | |
| 2011/0089470 A1 * | 4/2011 | Aoki | 257/203 |
| 2011/0227133 A1 * | 9/2011 | Morimoto | 257/204 |
| 2011/0254066 A1 * | 10/2011 | Miura | 257/296 |
| 2012/0087188 A1 * | 4/2012 | Hsieh et al. | 365/185.05 |
| 2012/0126422 A1 * | 5/2012 | Endo et al. | 257/774 |

FOREIGN PATENT DOCUMENTS

| | | |
|---|---|---|
| JP | 2000-077609 A | 3/2000 |
| JP | 2008-193070 A | 8/2008 |
| JP | 2010-073728 A | 4/2010 |
| JP | 2010-129895 A | 6/2010 |

* cited by examiner

*Primary Examiner* — Jarrett Stark
*Assistant Examiner* — Mohammad M Hoque

(57) ABSTRACT

Disclosed herein is a device that includes: a plurality of first standard cells arranged on a semiconductor substrate in a first direction, each of the first standard cells including at least one field-effect transistor; and a first power supply wiring extending in the first direction along one end of the first standard cells in a second direction. The field-effect transistor including a gate electrode formed on a gate wiring layer. The first power supply wiring being formed on the gate wiring layer.

22 Claims, 26 Drawing Sheets

SEMICONDUCTOR DEVICE HAVING PLURAL STANDARD CELLS

BACKGROUND OF THE INVENTION

1. Field of the Invention

The present invention relates to a semiconductor device, and more particularly to a semiconductor device that includes a circuit block composed of a plurality of standard cells.

2. Description of Related Art

A semiconductor device is typically designed by combining a plurality of needed standard cells to lay out circuit blocks having desired functions on a semiconductor substrate (see Japanese Patent Application Laid-open Nos. 2010-73728, 2000-77609, 2010-129895, and 2008-193070). "Standard cells" refer to pre-registered layouts of logic circuits having basic functions, such as an inverter circuit and a NAND gate circuit. Wirings for establishing internal connections of the standard cells are mainly formed on a first wiring layer that lies above a gate wiring layer. Wiring for connecting the standard cells, wiring for supplying input signals and power supply potentials from outside the circuit blocks, and wiring for supplying output signals to outside the circuit blocks are mainly formed on a second wiring layer that lies above the first wiring layer.

The wirings formed on the second wiring layer are typically laid out in one direction in parallel. The width of the wirings formed on the second wiring layer needs to be designed in consideration of characteristics (such as resistance) required for the wiring. In many cases, power supply wiring needs to be designed to have a greater wiring width than that of signal wiring. As the fine processing technology advances, standard cells having the same functions and the same characteristics may be made smaller than heretofore. Even in such cases, power supply wiring can be difficult to miniaturize in proportion to standard cells in order to satisfy characteristic requirements. A reduction in the size of standard cells has thus tended to increase the wiring density mainly of the second wiring layer.

The increased wiring density of the second wiring layer due to the miniaturization of standard cells matters little as long as the entire wiring can be properly laid out. However, the wiring may not always be able to be fully laid out. In such cases, wiring areas need to be secured by taking such measures as arranging free spaces and compensation capacitors between some standard cells. This increases the chip size.

Such a problem becomes pronounced as the types of power supply potentials needed for the circuit blocks increase. The reason is that, as mentioned above, the wiring width of power supply wiring is difficult to reduce. At least two types of power supply potentials are needed, including a high-level power supply potential (VDD) and a low-level power supply potential (VSS). Other examples include the well potential (VPW) of p-wells where n-channel metal oxide semiconductor (MOS) transistors are formed and the well potential (VNW) of n-wells where p-channel MOS transistors are formed. Under the circumstances, a technology for reducing the wiring density of a wiring layer lying above the gate wiring layer of a semiconductor device using standard cells has been desired.

SUMMARY

In one embodiment, there is provided a semiconductor device that includes: a plurality of first standard cells arranged on a semiconductor substrate in a first direction, each of the first standard cells including at least one field-effect transistor; and a first power supply wiring extending in the first direction along one end of the first standard cells in a second direction, the field-effect transistor including a gate electrode formed on a gate wiring layer, the first power supply wiring being formed on the gate wiring layer.

In another embodiment, there is provided a semiconductor device that includes: a first power supply wiring extending in a first direction and formed on a first wiring layer; a second power supply wiring extending in the first direction and formed on the first wiring layer, the second power supply wiring being provided independently of the first power supply wiring; and a third power supply wiring extending in a second direction different from the first direction and formed on a gate wiring layer on which a gate wiring of a transistor is formed, the third power supply wiring electrically connecting the first power supply wiring to the second power supply wiring.

In still another embodiment, there is provided a semiconductor device that includes: a cell rack on which a plurality of standard cells are arranged in a first direction; a first power supply wiring formed on a first wiring layer, the first power supply wiring being arranged along the cell rack in the first direction; a second power supply wiring formed on a second wiring layer, the second power supply wiring being arranged along the cell rack in the first direction, the second power supply wiring being provided independently of the first power supply wiring; and a third power supply wiring extending in a second direction different from the first direction to electrically connect the first power supply wiring to the second power supply wiring, the third power supply wiring being formed on one of the first wiring layer, the second wiring layer and a third wiring layer lying below the first and second wiring layers.

According to the present invention, the wiring density of a wiring layer lying above the gate wiring layer of a semiconductor device using standard cells can be reduced.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
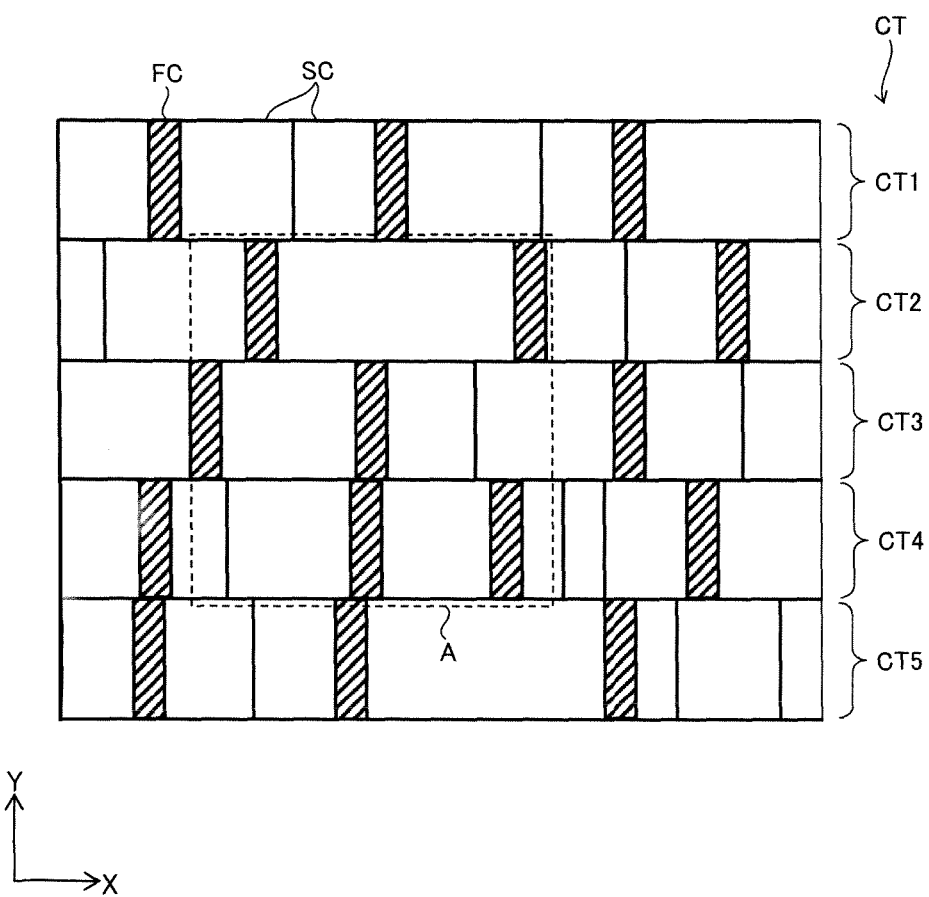
FIG. 1 is a schematic plan view for explaining the cell layout of a semiconductor device according to a preferred first embodiment of the present invention.

Referring now to FIG. 1, the drawing shows a plurality of blocks each representing a cell. The unhatched cells represent standard cells SC. The hatched cells represent feed cells FC. A cell is a unit circuit having a basic function. Layout pattern data about a plurality of cells is registered in a design tool in advance. A plurality of needed cells are combined to lay out circuit blocks having desired functions on a semiconductor substrate. This allows a significant reduction of the design time as compared to when the circuit blocks are laid out from scratch.

A standard cell SC is a logic circuit having a basic function. Examples of logic circuits to be registered as standard cells SC include an inverter circuit, a NAND gate circuit, a NOR gate circuit, and flip-flop circuits. A feed cell FC is a cell for feeding a well potential to a well region in a standard cell SC. Specific configurations of standard cells SC and feed cells FC will be described in detail later.

As shown in FIG. 1, a plurality of cell tracks CT are defined on the semiconductor substrate. The cells SC and FC are each laid out in any one of the cell tracks CT. The cell tracks CT refer to band-like areas extending in an X direction, with a constant width in a Y direction. The cell tracks CT may be referred to as "cell racks." FIG. 1 shows five cell tracks CT1 to CT5, whereas an actual semiconductor device includes more cell tracks CT. If there are two or more circuit blocks each including a plurality of cell tracks CT, the cell tracks CT in such circuit blocks need not extend in the same direction. For example, a plurality of cell tracks CT in a circuit block may extend in the X direction while a plurality of cell tracks CT in another circuit block extend in the Y direction.

Since the cells SC and FC are each laid out in any one of the cell tracks CT, the cells SC and FC have the same width in the Y direction as that of the cell tracks CT in the Y direction. In contrast, the cells SC and FC have various widths in the X direction, depending on the scale of the circuit included in each cell.

As shown in FIG. 1, a plurality of feed cells FC are laid out in each cell track CT. The plurality of feed cells FC are preferably arranged, though not limited to, not to adjoin each other within an identical cell track CT. In other words, each feed cell FC is preferably laid out to be interposed between two standard cells SC that are laid out in an identical cell track CT. The reason is to form mesh-like power supply wiring by the distributed insertion of the feed cells FC as will be described later.

Figure 2:
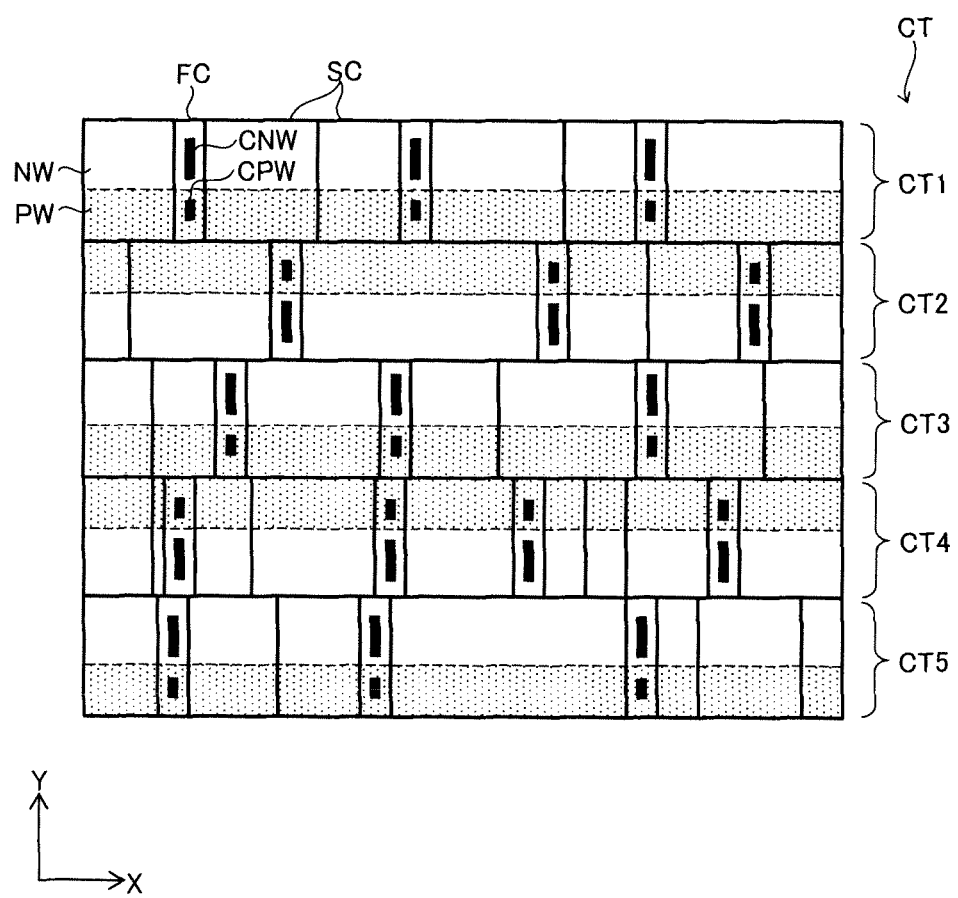
FIG. 2 is a schematic plan view for explaining the shapes of well regions and the positions of well-feeding contact conductors formed in the feed cells FC.

Turning to FIG. 2, the cell layout in FIG. 2 is the same as in FIG. 1.

In FIG. 2, the unhatched areas represent n-well regions NW. The hatched areas represent p-well regions PW. The n-well regions NW are where P-channel MOS transistors are formed. The p-well regions PW are where N-channel MOS transistors are formed. Note that transistors to be formed in the standard cells SC are not limited to MOS transistors. Other types of field-effect transistors, such as a metal insulator semiconductor (MIS) transistor, may be used.

As shown in FIG. 2, the n-well regions NW and the p-well regions PW are formed to extend in the X direction and alternately in the Y direction. Each cell track CT is defined to include both an n-well region NW and a p-well region PW. Cell tracks CT adjoining in the Y direction include an n-well region NW and a p-well PW in a reverse positional relationship. Specifically, the cell tracks CT1, CT3, and CT5 include an n-well region NW upward in FIG. 2 and a p-well region PW downward in FIG. 2. The cell tracks CT2 and CT4 include an n-well region NW downward in FIG. 2 and a p-well region PW upward in FIG. 2. Consequently, cell tracks CT adjoining in the Y direction can share an n-well region NW or a p-well region PW. For example, the cell tracks CT1 and CT2 share a p-well region PW. The cell tracks CT2 and CT3 share an n-well region NW. Due to such sharing, each well region can be designed to have a large area. This can reduce well boundaries and allows efficient use of the surface of the semiconductor substrate. Note that the sharing of the well regions between adjoining cell tracks CT is not indispensable to the present invention.

As shown in FIG. 2, each feed cell FC includes well-feeding contact conductors CNW and CPW. The contact conductor CNW is a contact conductor for supplying a well potential to the n-well region NW. The contact conductor CPW is a contact conductor for supplying a well potential to the p-well region PW. In the semiconductor device according to the present embodiment, the standard cells SC include no well-feeding contact conductor CNW or CPW, though not limited thereto. In the present embodiment, the well potentials inside the standard cells SC are all supplied through the feed cells FC. Such a configuration allows a reduction in the size of the standard cells SC as compared to when the standard cells SC include well-feeding contact conductors CNW and CPW.

Figure 3:
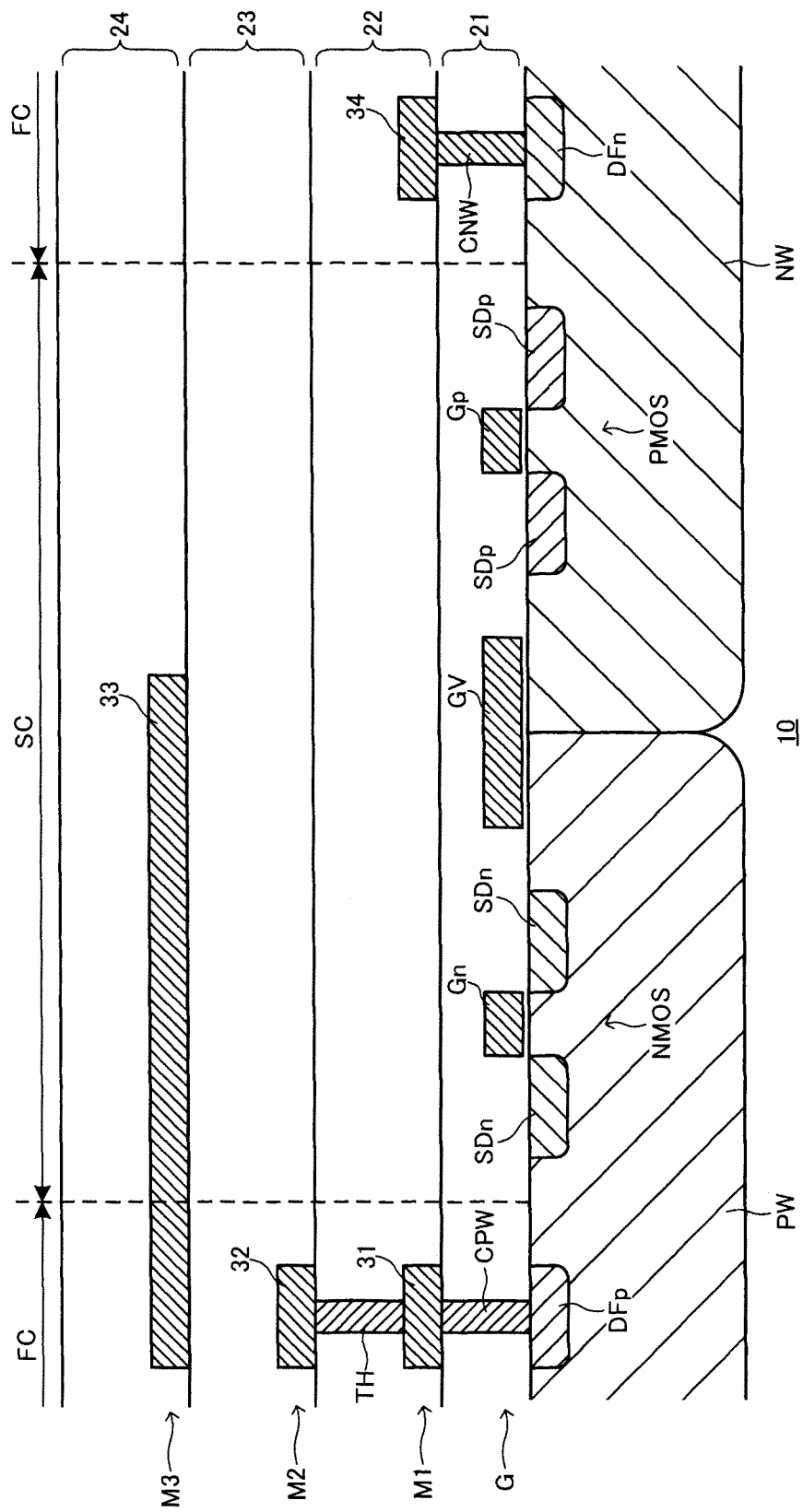
FIG. 3 is a sectional view showing a part of a standard cell SC and feed cells FC.

As shown in FIG. 3, four wiring layers G and M1 to M3 are allocated on the semiconductor substrate 10. The lowermost layer is a gate wiring layer G. Gate electrodes Gn and Gp and a power supply wiring GV are formed on the gate wiring layer G. The gate electrode Gn refers to the gate electrode of an N-channel MOS transistor NMOS formed in the p-well region PW. The gate electrode Gp refers to the gate electrode of a P-channel MOS transistor PMOS formed in the n-well region NW. The power supply wiring GV will be described later.

The N-channel MOS transistor NMOS includes n-type source/drain regions SDn which are formed in the p-well region PW. The gate electrode Gn is arranged on a channel region lying between the pair of source/drain regions SDn. Similarly, the P-channel MOS transistor PMOS includes p-type source/drain regions SDp which are formed in the n-well region NW. The gate electrode Gp is arranged on a channel region lying between the pair of source/drain regions SDp. Such transistors NMOS and PMOS are formed inside the standard cell SC.

A feeding diffusion region DFp is formed in the p-well region PW. The diffusion region DFp is a region for feeding a well potential to the p-well region PW. The diffusion region DFp is of $p^+$ type, having a higher impurity concentration than that of the p-well region PW. Similarly, a feeding diffusion region DFn is formed in the n-well region NW. The diffusion region DFn is a region for supplying a well potential to the n-well region NW. The diffusion region DFn is of $n^+$ type, having a higher impurity concentration than that of the n-well region NW. The diffusion regions DFp and DFn are formed in the feed cells FC.

A first wiring layer M1, a second wiring layer M2, and a third wiring layer M3 are allocated in that order above the gate wiring layer G. As shown in FIG. 3, the first wiring layer M1 is formed on the surface of an interlayer insulation film 21 which covers the gate wiring layer G. The second wiring layer M2 is formed on the surface of an interlayer insulation film 22 which covers the first wiring layer M1. The third wiring layer M3 is formed on the surface of an interlayer insulation film 23 which covers the second wiring layer M2. As an example, FIG. 3 shows wirings 31 and 34 formed on the first wiring layer M1, a wiring 32 formed on the second wiring layer M2, and a wiring 33 formed on the third wiring layer M3. In the present invention, the number of wiring layers above the gate wiring layer G need not necessarily be three. Two layers or less, or four or more layers may be arranged.

Two wirings formed on different wiring layers can be connected to each other via a through hole conductor TH that is formed to run through the interlayer insulation film(s) lying therebetween. In the example shown in FIG. 3, the wiring 31 and the wiring 32 are connected to each other by the through hole conductor TH formed to run through the interlayer insulation film 22. The diffusion regions formed on the semiconductor substrate 10 are connected to the upper wiring layers through contact conductors that are formed to run through the interlayer insulation film 21. In the example shown in FIG. 3, the wiring 31 and the diffusion region DFp are connected to each other by a contact conductor CPW formed to run through the interlayer insulation film 21. The wiring 34 and the diffusion region DFn are connected to each other by a contact conductor CNW formed to run through the interlayer insulation film 21. As has been described with reference to FIG. 2, the contact conductors CNW and CPW are arranged inside the feed cells FC.

Figure 4:
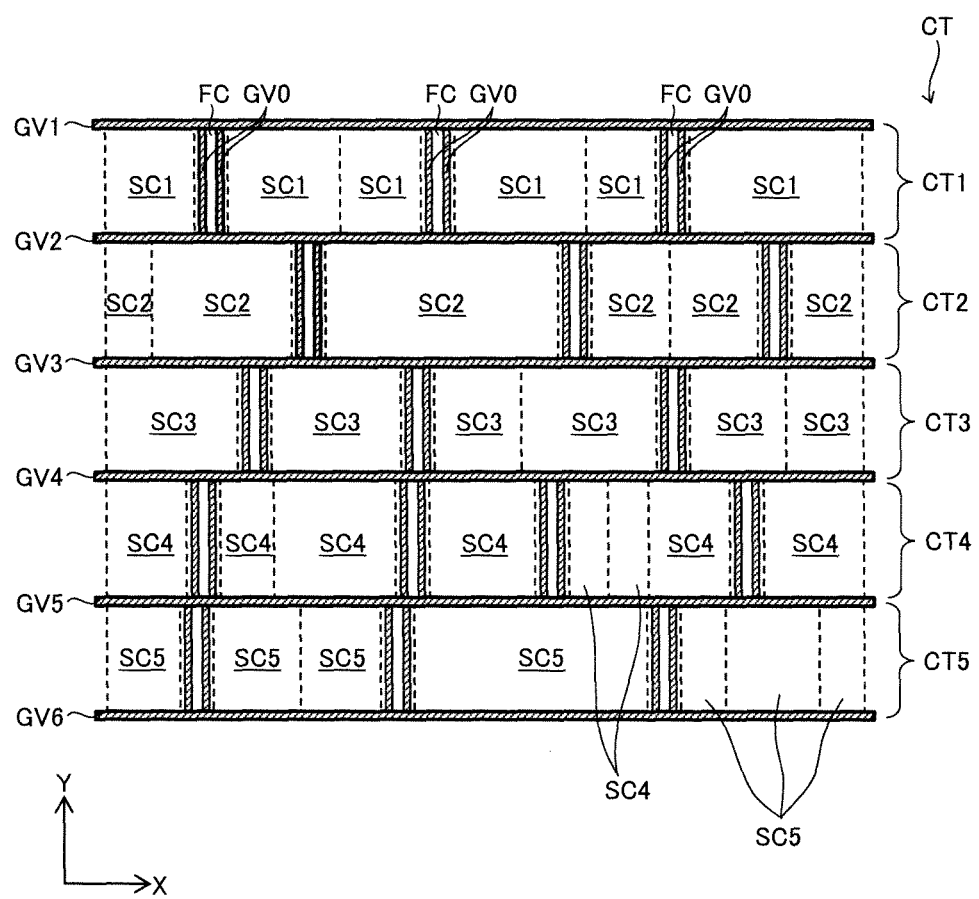
FIG. 4 is a schematic plan view showing the layout of the power supply wiring GV.

Turing to FIG. 4, the cell layout in FIG. 4 is the same as in FIG. 1. Each block shown by broken lines represents a cell.

As shown in FIG. 4, the power supply wiring GV is formed to extend in the X direction along between cell tracks CT adjoining in the Y direction, and to extend in the Y direction in the feed cells FC. The portions extending in the X direction and those extending in the Y direction are short-circuited with each other to form the mesh-like power supply wiring GV.

More specifically, suppose that the standard cells SC arranged in the cell tracks CT1 to CT5 are defined as standard cells SC1 to SC5, respectively. Power supply wirings GV1 to GV5 extend in the X direction along one ends (upper ends shown in FIG. 4) of the standard cells SC1 to SC5 in the Y direction, respectively. The power supply wirings GV2 to GV5 and a power supply wiring GV6 extend in the X direction along the other ends (lower ends shown in FIG. 4) of the standard cells SC1 to SC5 in the Y direction, respectively. The one ends (upper ends shown in FIG. 4) of the standard cells SC2 to SC5 in the Y direction coincide with the other ends (lower ends shown in FIG. 4) of the standard cells SC1 to SC4 in the Y direction. Consequently, in FIG. 4, there are six power supply wirings GV1 to GV6 extending in the X direction.

In each of the feed cells FC arranged in each of the cell tracks CT1 to CT5, two power supply wirings GV0 extend in the Y direction. Each of the power supply wirings GV0 are connected at one ends to the corresponding one of the power supply wirings GV1 to GV5, and at the other ends to the corresponding one of the power supply wirings GV2 to GV6. As a result, the power supply wirings GV0 to GV6 form a mesh-like configuration. As has been described with reference to FIG. 3, the power supply wirings GV0 to GV6 are formed on the gate wiring layer G. In other words, the power supply wirings GV0 to GV6 are formed on the same wiring layer as the gate electrodes Gn and Gp of the transistors NMOS and PMOS are.

Turing to FIG. 5, specific cell layout patterns will be described.

Figure 5:
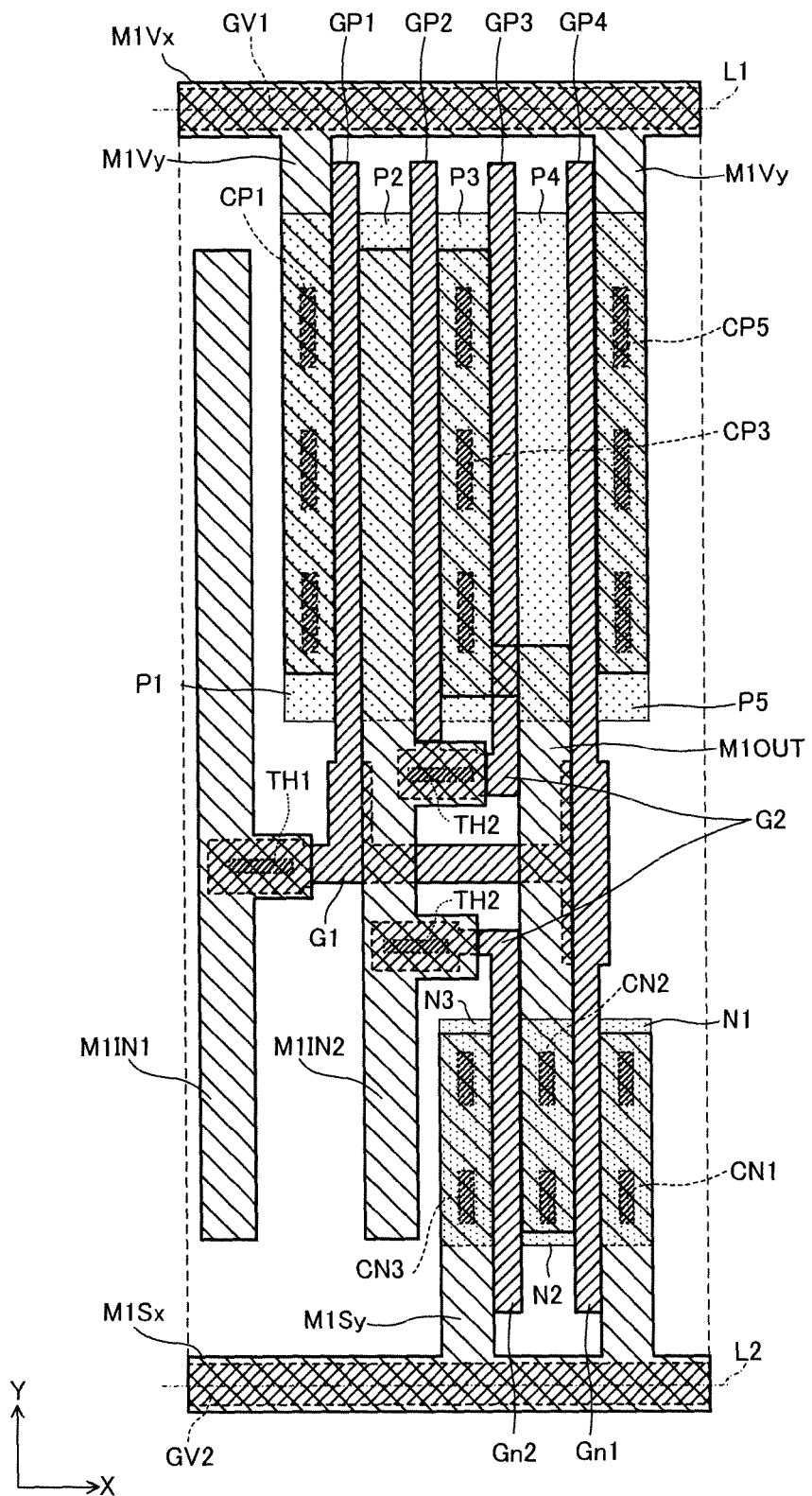
FIG. 5 is a perspective plan view showing an example of the layout pattern of a standard cell SC.
Figure 6:
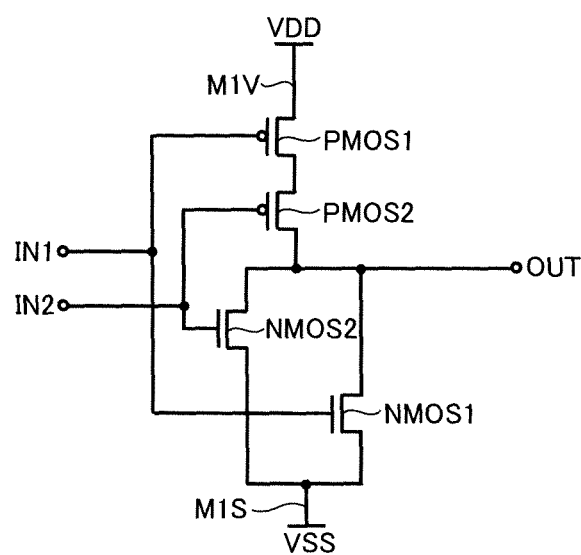
FIG. 6 is an equivalent circuit diagram of the two-input NOR gate circuit shown in FIG. 5.

The standard cell SC shown in FIG. 5 is a two-input NOR gate circuit. As shown in FIG. 6, the two-input NOR gate circuit includes two P-channel MOS transistors PMOS1 and PMOS2 connected in series and two N-channel MOS transistors NMOS1 and NMOS2 connected in parallel. The transistors PMOS1 and PMOS2 are connected in series between power supply wiring M1V and an output node OUT. A high-level power supply potential VDD is supplied to the power supply wiring M1V. The gate electrodes of the transistors PMOS1 and PMOS2 are connected to respective corresponding input nodes IN1 and IN2. The transistors NMOS1 and NMOS2 are connected in parallel between the output node OUT and power supply wiring M1S. A low-level power supply potential VSS is supplied to the power supply wiring M1S. The gate electrodes of the transistors NMOS1 and NMOS2 are connected to the respective corresponding input nodes IN1 and IN2.

The two P-channel MOS transistors PMOS1 and PMOS2 are composed of five p-type diffusion regions P1 to P5 and four gate electrodes Gp1 to Gp4 shown in FIG. 5. Specifically, the p-type diffusion regions P1 and P2, the interposed gate electrode Gp1, the p-type diffusion regions P4 and P5, and the interposed gate electrode Gp4 constitute the transistor PMOS1 shown in FIG. 6. The p-type diffusion regions P2 and P3, the interposed gate electrode Gp2, the p-type diffusion regions P3 and P4, and the interposed gate electrode Gp3 constitute the transistor PMOS2 shown in FIG. 6. The p-type diffusion regions P1 and P5 are connected to the power supply wiring M1V formed on the first wiring layer M1 through contact conductors CP1 and CP5. The power supply wiring M1V includes wiring portions M1Vy and a wiring portion M1Vx. The wiring portions M1Vy are formed over the p-type diffusion regions P1 and P5 and extend in the Y direction. The wiring portion M1Vx extends in the X direction along one end L1 of the standard cell SC in the Y direction. The wiring portion M1Vx is located to overlap the power supply wiring GV1 when seen in a plan view. The power supply wiring GV1 simply passes through the standard cell SC along the end L1 and is not connected to any node in the standard cell SC.

The two N-channel MOS transistors NMOS1 and NMOS2 are composed of three n-type diffusion regions N1 to N3 and two gate electrodes Gn1 and Gn2 shown in FIG. 5. Specifically, the n-type diffusion regions N1 and N2 and the interposed gate electrode Gn1 constitute the transistor NMOS1 shown in FIG. 6. The n-type diffusion regions N2 and N3 and the interposed gate electrode Gn2 constitute the transistor NMOS2 shown in FIG. 6. The n-type diffusion regions N1 and N3 are connected to the power supply wiring M1S formed on the first wiring layer M1 through contact conductors CN1 and CN3. The power supply wiring M1S includes wiring portions M1Sy and a wiring portion M1Sx. The wiring portions M1Sy are formed over the n-type diffusion regions N1 and N3 and extend in the Y direction. The wiring portion M1Sx extends in the X direction along the other end L2 of the standard cell SC in the Y direction. The wiring portion M1Sx is located to overlap the power supply wiring GV2 when seen in a plan view. The power supply wiring GV2 simply passes through the standard cell SC along the end L2 and is not connected to any node in the standard cell SC.

The p-type diffusion region P3 and the n-type diffusion region N2 are connected to a signal wiring M1OUT formed on the first wiring layer M1 in common through contact conductors CP3 and CN2, respectively. The signal wiring M1OUT corresponds to the output node OUT of the NOR gate circuit shown in FIG. 6. The gate electrodes Gp1, Gp4, and Gn1 are connected to a signal wiring M1IN1 formed on the first wiring layer M1 via a signal wiring G1 formed on the gate wiring layer G and a through hole conductor TH1. The signal wiring M1IN1 corresponds to one of the input nodes, IN1, of the NOR gate circuit shown in FIG. 6. The gate electrodes Gp2, Gp3, and Gn2 are connected to a signal wiring M1IN2 formed on the first wiring layer M1 via a signal wiring G2 formed on the gate wiring layer G and through hole conductors TH2. The signal wiring M1IN2 corresponds to the other input node IN2 of the NOR gate circuit shown in FIG. 6.

Figure 7:
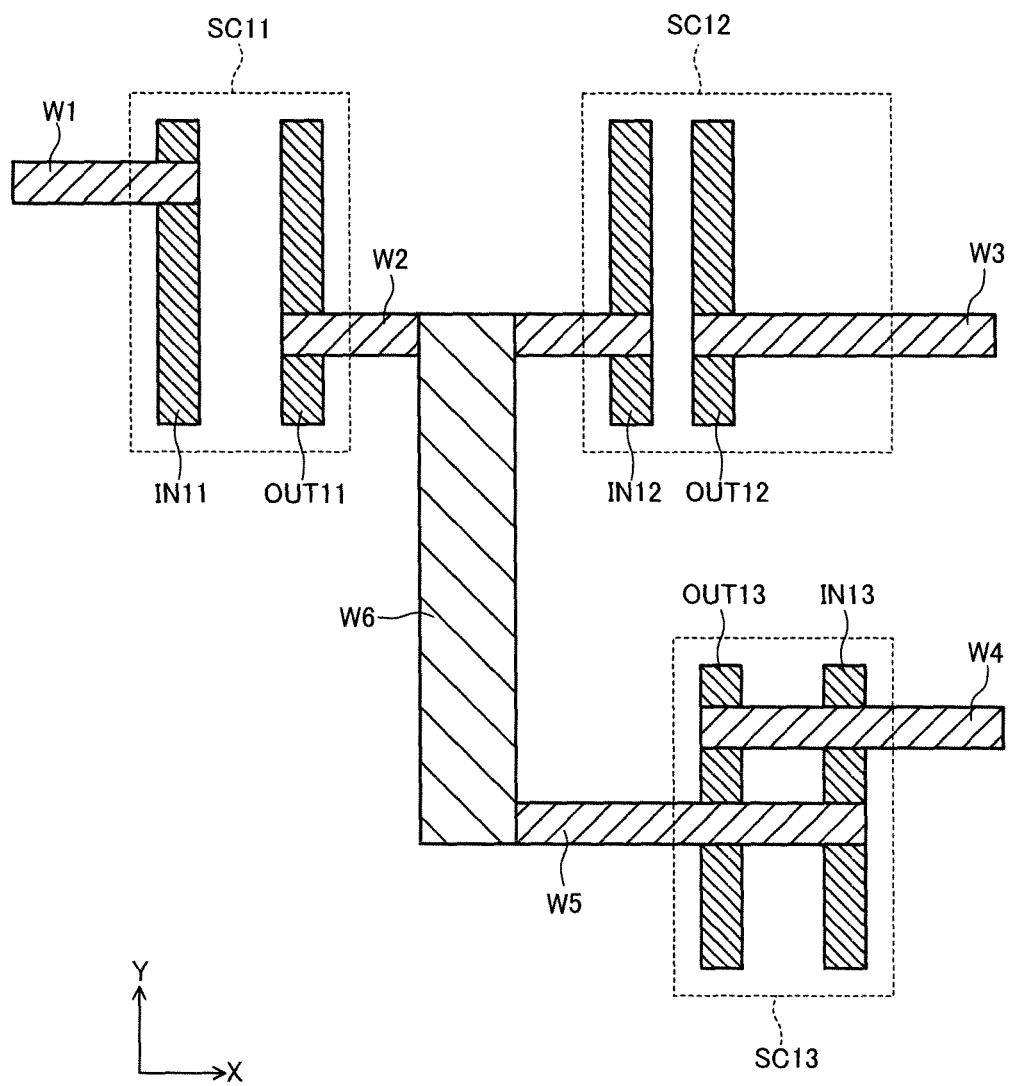
FIG. 7 is a plan view for explaining a method to connect nodes between a plurality of standard cells SC.

The nodes inside the standard cell SC are mainly connected by using the wirings that are formed on the first wiring layer M1 and extend in the Y direction. Meanwhile, as shown in FIG. 7, nodes between a plurality of standard cells SC are mainly connected by using wirings that are formed on the second wiring layer M2 or the third wiring layer M3. FIG. 7 shows three standard cells SC11 to SC13. The standard cells SC11 to SC13 are connected by using the second wiring layer M2 and the third wiring layer M3.

More specifically, the standard cell SC11 and the standard cell SC12 are arranged in the same cell track. The standard cell SC13 is arranged in a cell track different from that of the standard cells SC11 and SC12. The standard cells SC11 and SC12 thus have the same Y coordinate. The standard cells SC11 and SC12 and the standard cell SC13 have different Y coordinates. In the example shown in FIG. 7, the standard cells SC11 to SC13 include input nodes IN11 to IN13 and output nodes OUT11 to OUT13, respectively. Each of the input nodes IN11 to IN13 and the output nodes OUT11 to OUT13 is constituted by a signal wiring that is formed on the first wiring layer M1 and extends in the Y direction.

In the example shown in FIG. 7, a signal wiring W1 is connected to the input node IN11 of the standard cell SC11. A signal wiring W2 is connected between the output node OUT11 of the standard cell SC11 and the input node IN12 of the standard cell SC12. A signal wiring W3 and a signal wiring W4 are connected to the output nodes OUT12 and OUT13 of the standard cells SC12 and SC13, respectively. The signal wiring W2 and the input node IN13 of the standard cell SC13 is connected through signal wirings W5 and W6. The signal wirings W1 to W5 are formed on the second wiring layer M2 so as to extend in the X direction. The signal wiring W6 is formed on the third wiring layer M3 so as to extend in the Y direction. In such a manner, a plurality of standard cells are connected by using wirings that are formed on the second wiring layer M2 and mainly extend in the X direction. If a plurality of standard cells to be connected have different Y coordinates, wirings that are formed on the third wiring layer M3 and mainly extend in the Y direction are used in part.

Figure 8:
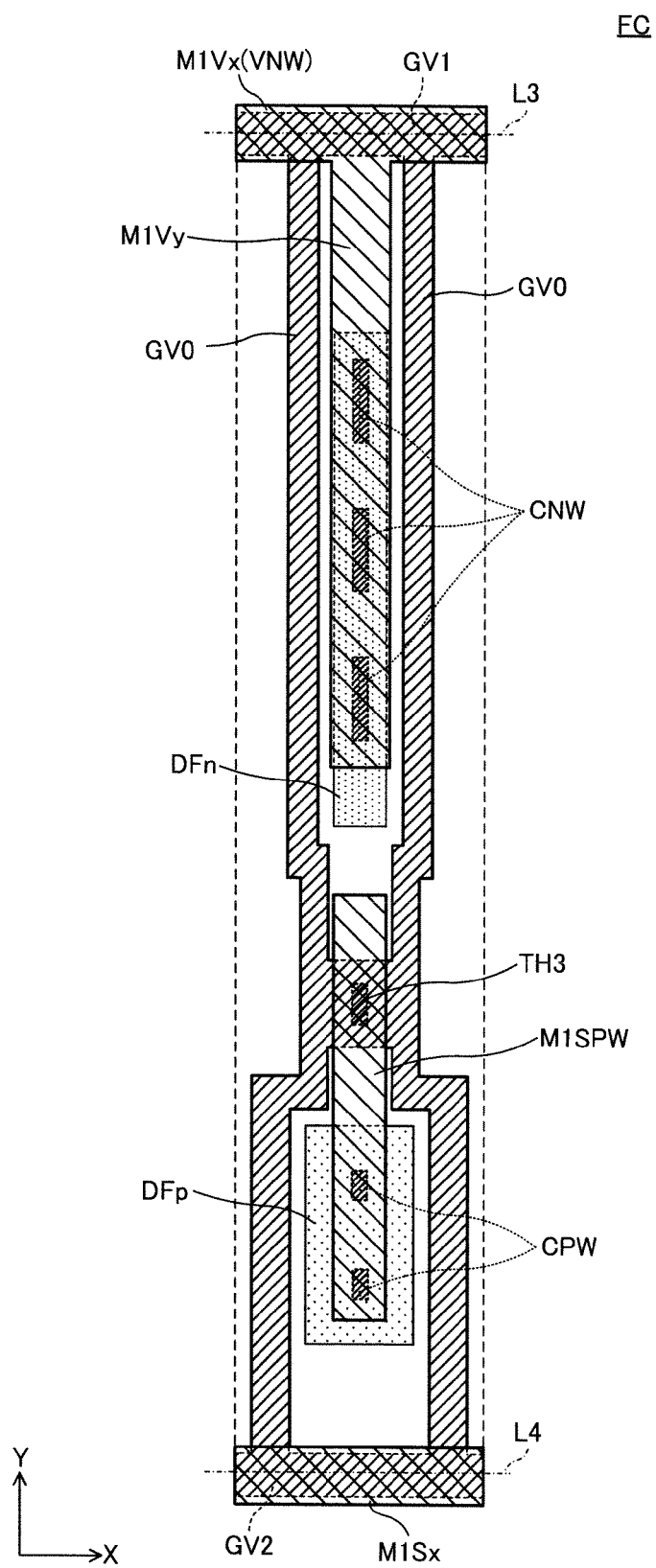
FIG. 8 is a perspective plan view showing an example of the layout pattern of a feed cell FC.

Turning to FIG. 8, the feed cell FC includes two power supply wirings GV0 which extend in the Y direction. The power supply wirings GV0 are connected at one ends to the power supply wiring GV1 which extends in the X direction along one end L3 of the feed cell FC. The other ends of the power supply wirings GV0 are connected to the power supply wiring GV2 which extends in the X direction along the other end L4 of the feed cell FC. The power supply wiring GV0 thus functions to connect the two power supply wirings GV1 and GV2 having different Y coordinates. The mesh-like power supply wiring is thereby formed as has been described with reference to FIG. 4.

At the one end L3 of the feed cell FC, the wiring portion M1Vx of the power supply wiring M1V is arranged on a layer above the power supply wiring GV1. The wiring portion M1Vx is connected to the wiring portions M1Vy extending in the Y direction. The wiring portions M1Vy corresponds to the wiring 34 shown in FIG. 3 and is connected to the feeding diffusion region DFn through the contact conductors CNW. As a result, the high-level power supply potential VDD serving as the well potential VNW is supplied to the n-well region NW in the feed cell FC through the power supply wiring M1V. Note that in the present invention, the well potential VNW of the n-well region NW need not necessarily coincide with the source potential VDD of the transistors PMOS in the standard cells SC. A potential different from the source potential VDD may be applied if the back bias of the transistors PMOS needs to be controlled.

At the other end L4 of the feed cell FC, the wiring portion M1Sx of the power supply wiring M1S is arranged above the power supply wiring GV2. In the present embodiment, the power supply wiring M1S is not extended into the feed cell FC and simply passes through the feed cell FC along the end L4. The reason is that in the present embodiment, a potential different from the low-level power supply potential VSS is applied as the well potential of the p-well region PW. In the present embodiment, the well potential VPW different from the low-level power supply potential VSS is applied as the well potential of the p-well region PW. Note that in the present invention, the well potential VPW of the p-well region PW need not necessarily differ from the source voltage VSS of the transistors NMOS in the standard cells SC. The source voltage VSS of the transistors NMOS may be used as the well potential VPW of the p-well region PW.

Figure 9:
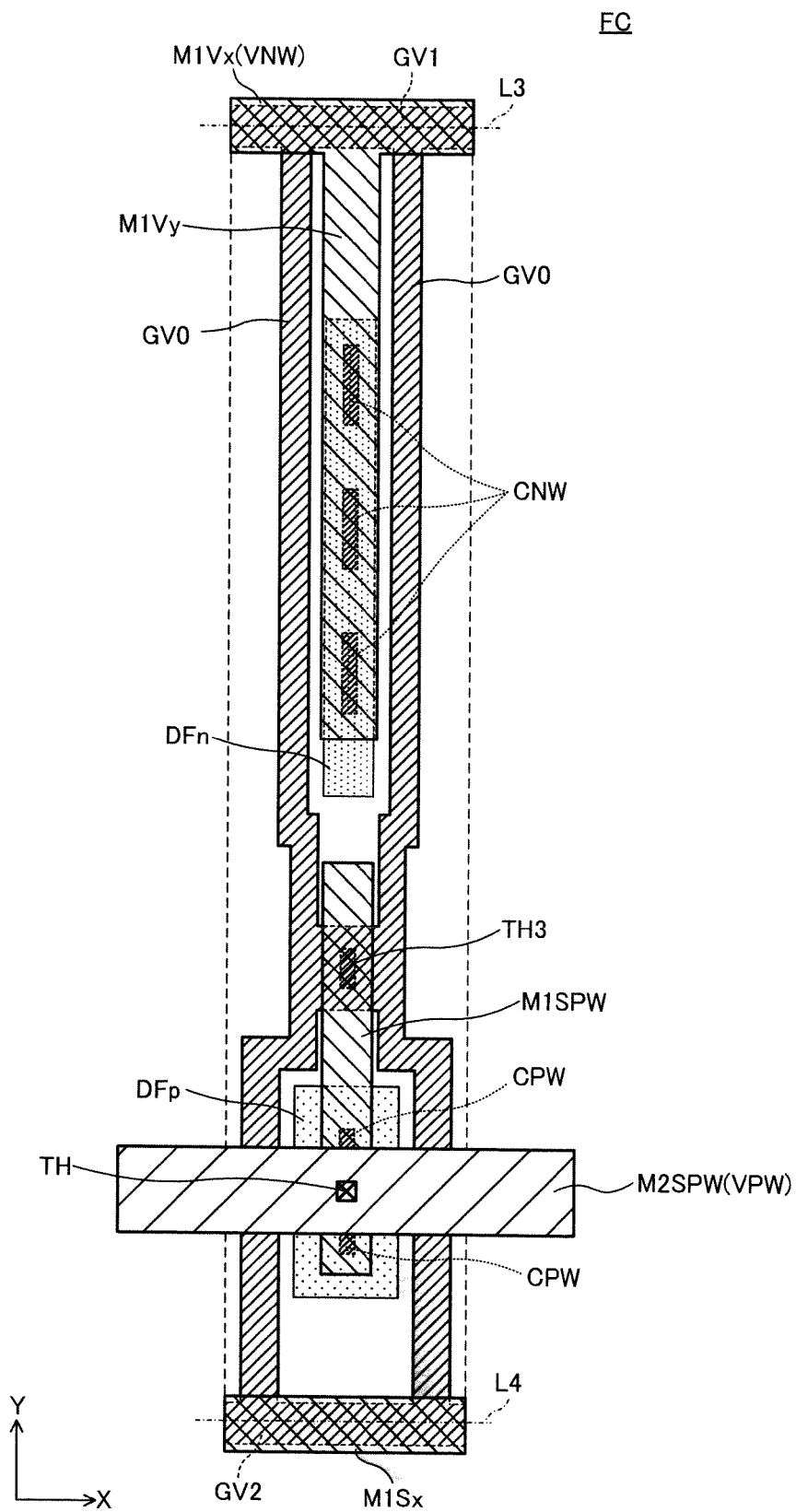
FIG. 9 is a perspective plan view showing a feed cell FC connected to a power supply wiring M2SPW.

As shown in FIG. 8, the power supply wiring GV0 in the feed cell FC is connected to one end of power supply wiring M1SPW via a through hole conductor TH3. The power supply wiring M1SPW is a wiring formed on the first wiring layer M1 so as to extend in the Y direction in the feed cell FC. The other end of the power supply wiring M1SPW is connected to the diffusion region DFp on the underlying layer through the contact conductors CPW. As shown in FIG. 9, in some feed cells FC, the other end of the power supply wiring M1SPW is connected to a power supply wiring M2SPW on an upper layer via a through hole conductor TH. The power supply wirings M1SPW and M2SPW correspond to the wirings 31 and 32 shown in FIG. 3, respectively. The power supply wiring M2SPW is thus formed on the second wiring layer M2. The contact conductors CPW and the through hole conductor TH correspond to the components designated by the same symbols in FIG. 3.

With such a configuration, as shown in FIG. 9, when the well potential VPW is supplied through the power supply wiring M2SPW, the well potential VPW is supplied to the p-well region PW through the feeding diffusion region DFp as well as to the mesh-like power supply wiring GV. Since the power supply wiring GV according to the present embodiment has the mesh-like configuration, not all the feed cells FC need to be connected with the power supply wiring M2SPW shown in FIG. 9. The well potential VPW can be supplied to all the cell tracks CT if at least one of the feed cells FC included in each cell track CT is connected with the power supply wiring M2SPW. This can reduce the wiring density of the wiring formed on the second wiring layer M2.

As described above, in the present embodiment, a potential different from the source potential VSS of the transistors NMOS is used as the well potential VPW of the p-well regions PW. A total of three types of power supply potentials are therefore needed, including the high-level power supply potential VDD. According to the present embodiment, the mesh-like power supply wiring GV is formed by using the gate wiring layer G, and the well potential VPW is supplied to the power supply wiring GV. This can reduce the number of traces of the power supply wiring M2SPW to be formed on the second wiring layer M2.

Figure 10:
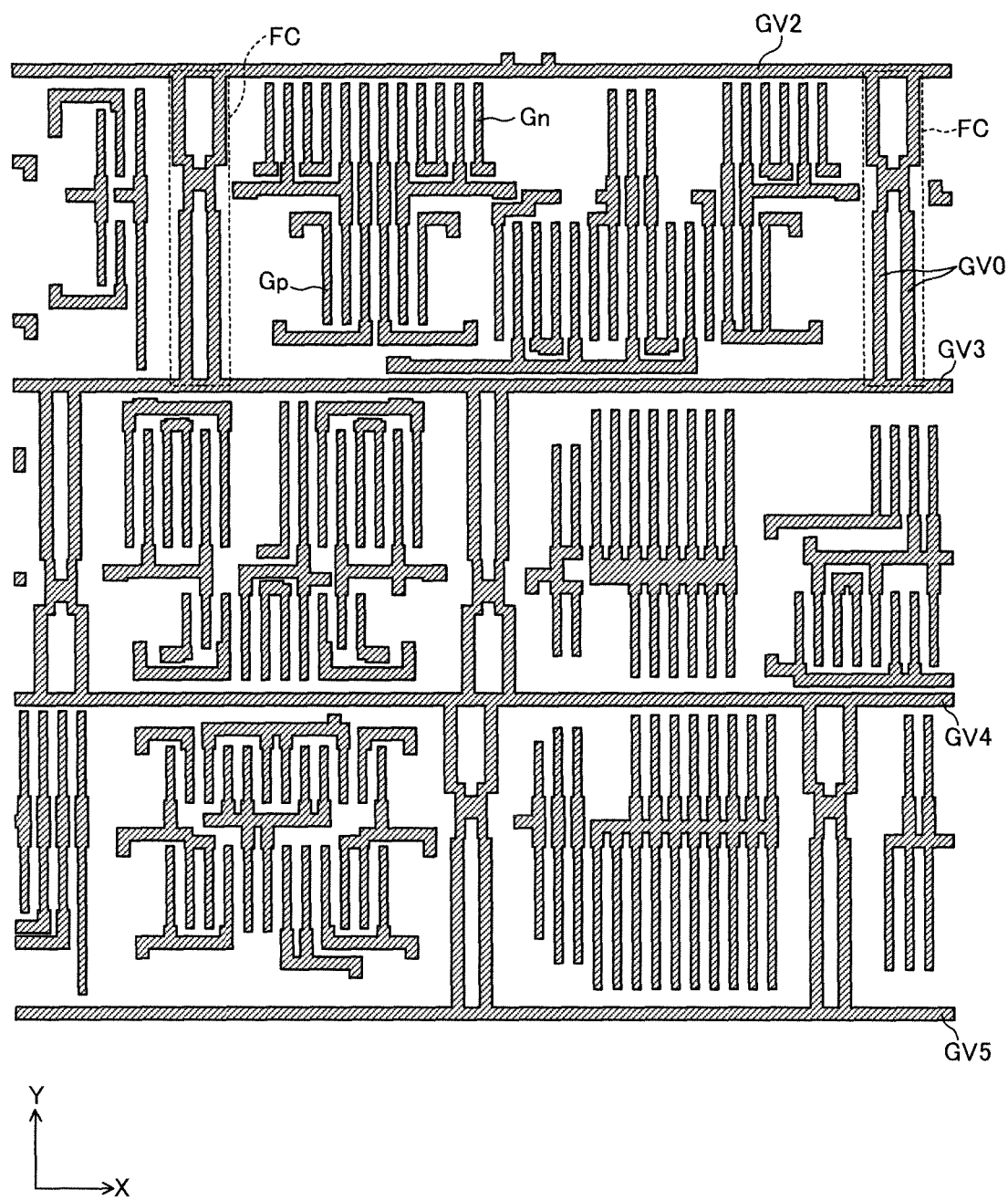
FIG. 10 is enlarged views of the area A shown in FIG. 1 and shows only wirings formed on the gate wiring layer G.
Figure 11:
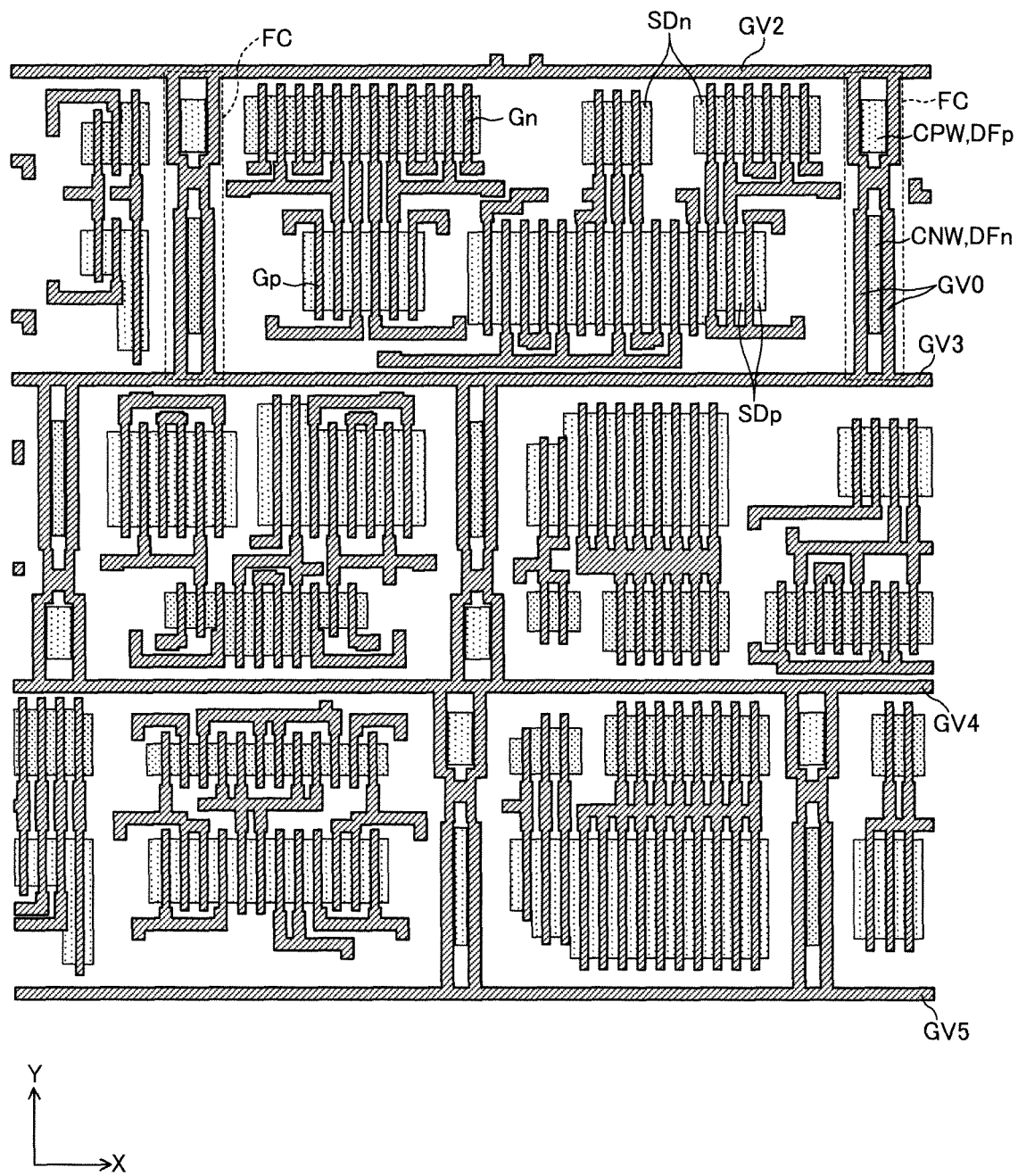
FIG. 11 is enlarged views of the area A shown in FIG. 1 and shows diffusion regions in addition to FIG. 10.

Turning to FIG. 10, the gate wiring layer G includes the mesh-like power supply wiring GV, the gate electrodes Gn and Gp, and the signal wirings connected thereto. Of the mesh-like power supply wiring GV, the portions GV2 to GV5 extending in the X direction are arranged along the ends of the standard cells SC where no transistor is formed. The provision of such portions therefore will not increase the width of the standard cells SC in the Y direction. Since the portions GV0 of the mesh-like power supply wiring GV extending in the Y direction are arranged in the feed cells FC, each cell track CT needs to include at least one feed cell FC. However, as shown in FIG. 11, in the present embodiment, the standard cells SC need not include the feeding diffusion regions DFp and DFn or the contact conductors CNW and CPW. The standard cells SC can thus be reduced in size accordingly. This can consequently reduce the occupied area on the semiconductor substrate 10.

Figure 12:
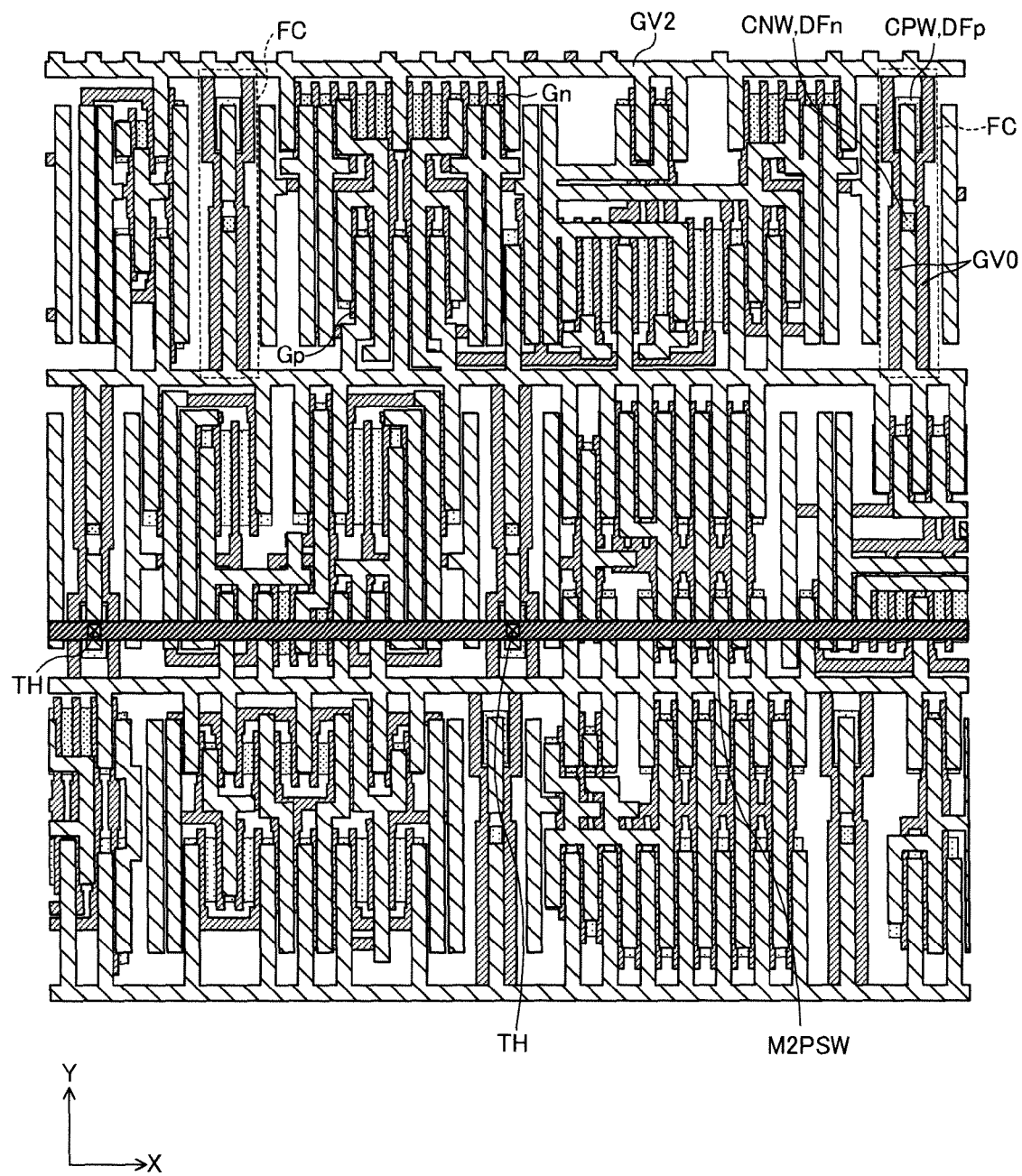
FIG. 12 is a diagram showing the wiring formed on the first wiring layer M1 and the power supply wiring M2SPW formed on the second wiring layer M2 in addition to FIG. 11.

As described above, in the present embodiment, the well potential VPW of the p-well regions PW is supplied to the mesh-like power supply wiring GV. As shown in FIG. 12, the second wiring layer M2 therefore need not include a large number of the power supply wirings M2SPW each extending in the X direction. In the example shown in FIG. 12, there is provided only one power supply wiring M2SPW extending in the X direction. This can reduce the number of power supply wirings to be formed on the second wiring layer M2. The wiring width and the number of the wirings to be formed on the second wiring layer M2 can thus be increased accordingly. Sufficient wiring areas can thus be secured even under the circumstances where the wiring width and/or the number of the wirings are difficult to reduce in proportion to the miniaturization of the standard cells SC.

Figure 13:
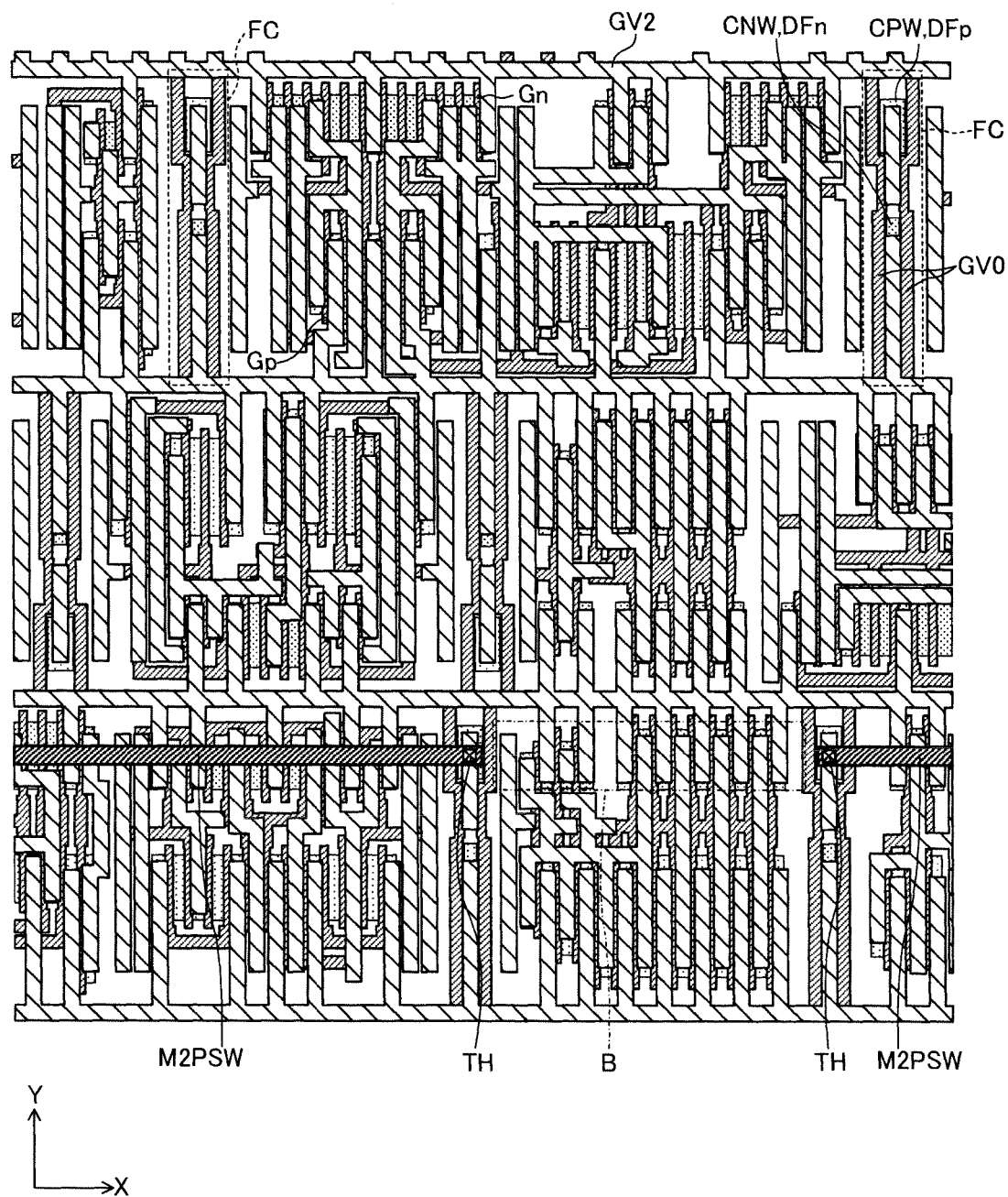
FIG. 13 is schematic plan view showing a first example in which two power supply wirings M2SPW are connected to feed cells FC.
Figure 14:
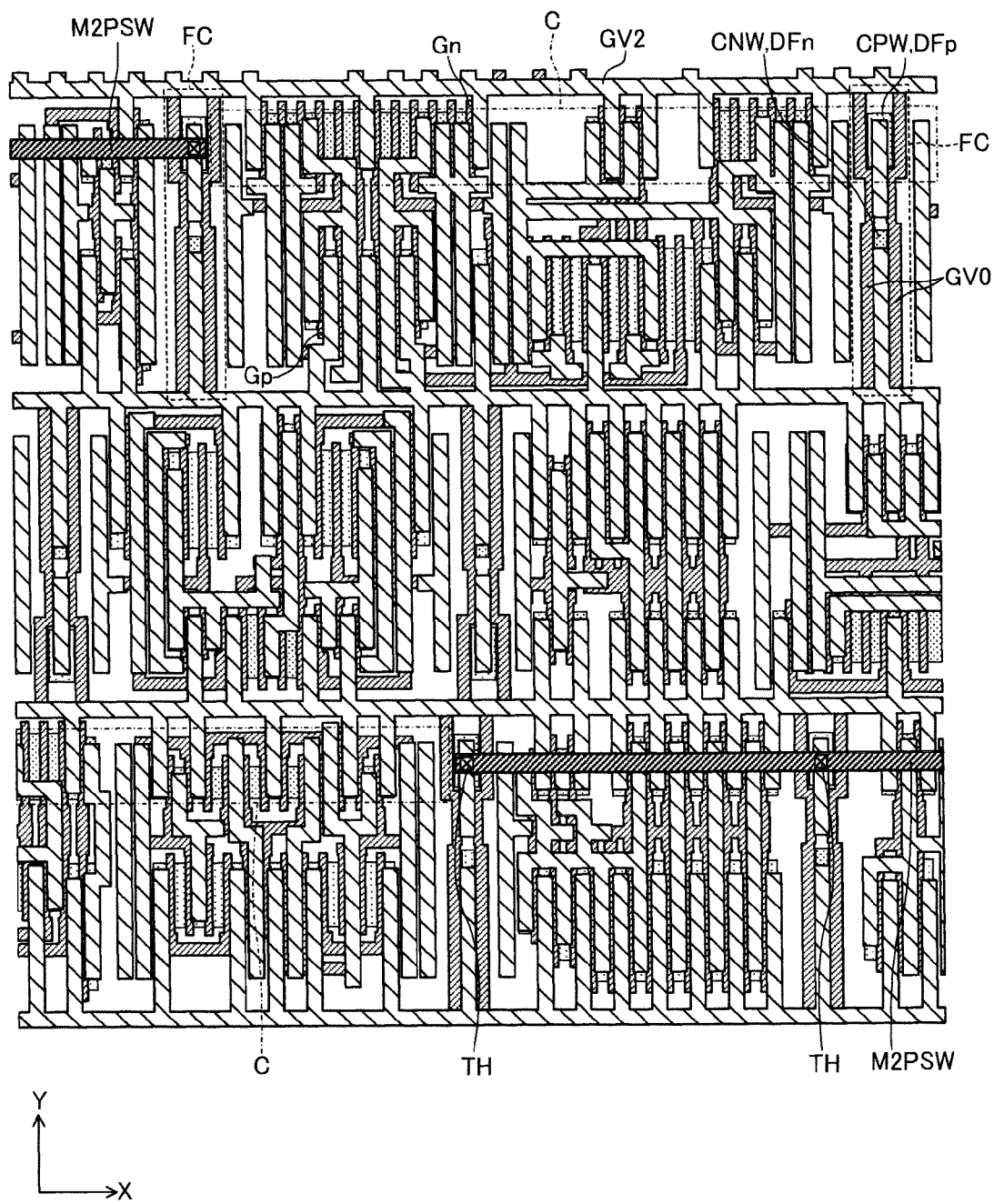
FIG. 14 is schematic plan view showing a second example in which two power supply wirings M2SPW are connected to feed cells FC.

In the example shown in FIG. 12, a single power supply wiring M2SPW extending in the X is used. However, the present invention is not limited thereto. In another example, as shown in FIG. 13, two power supply wirings M2SPW each extending in the X direction may be used. The ends of the power supply wirings M2SPW are connected to feed cells FC. According to such an example, wiring running through the area B shown in FIG. 13 in the Y direction can be formed on the second wiring layer M2. When two or more power supply wirings M2SPW are used, the power supply wirings M2SPW may have respective different Y coordinates as shown in FIG. 14. In such a case, the areas C of the second wiring layer M2 having the same Y coordinates as those of the respective power supply wirings M2SPW become available for the formation of other wiring.

Figure 15:
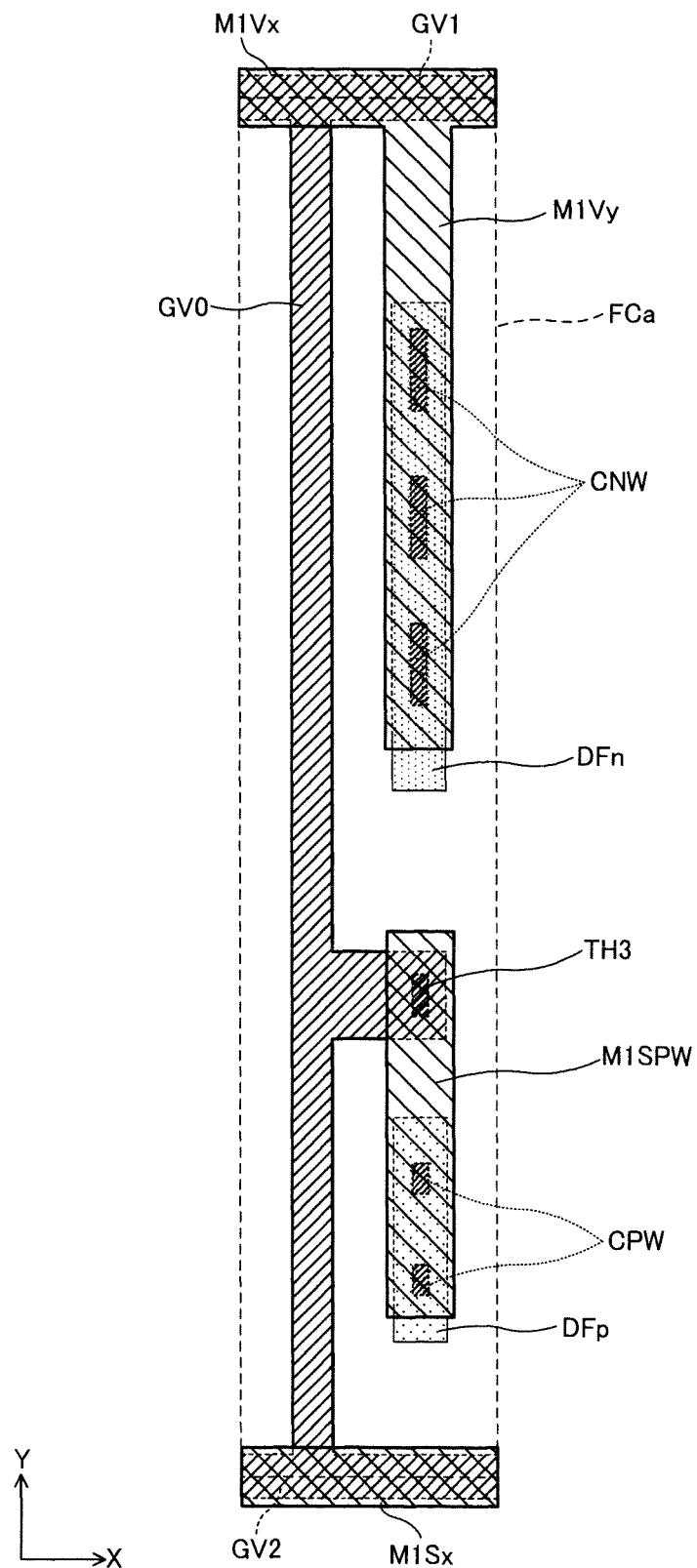
FIG. 15 is a perspective plan view showing a layout pattern of a feed cell FCa according to a modification.
Figure 16:
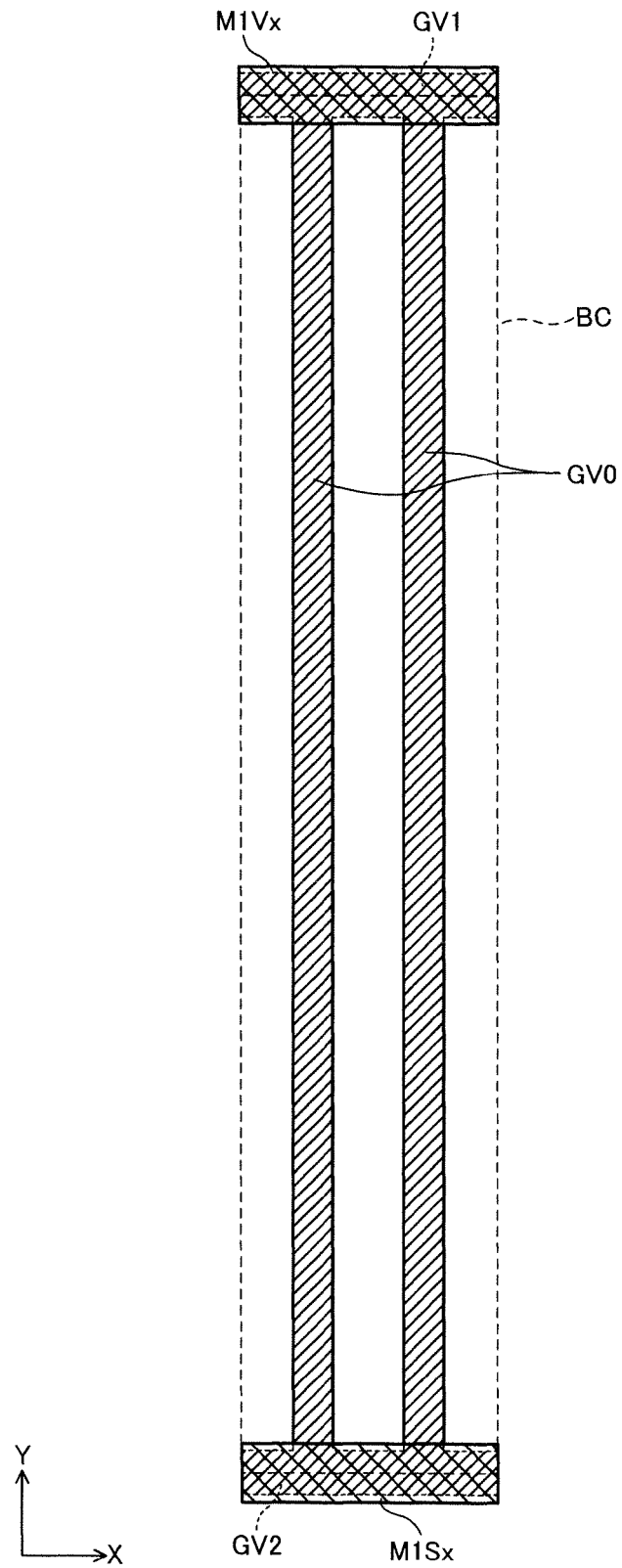
FIG. 16 is a perspective plan view showing a layout pattern of a bypass cell BC.

The feed cell FC shown in FIG. 8 includes two power supply wirings GV0 each extending in the Y direction. However, the present invention is not limited thereto. In another example, as shown in FIG. 15, a feed cell FCa including a single power supply wiring GV0 extending in the Y direction may be used. In yet another example, as shown in FIG. 16, a bypass cell BC including the power supply wiring GV0 extending in the Y direction without the feeding diffusion regions DFp and DFn and the contact conductors CNW and CPW may be used. When the bypass cell BC shown in FIG. 16 is used, the same cell track CT needs to include at least one cell that includes the feeding diffusion regions DFp and DFn and the contact conductors CNW and CPW.

Figure 17:
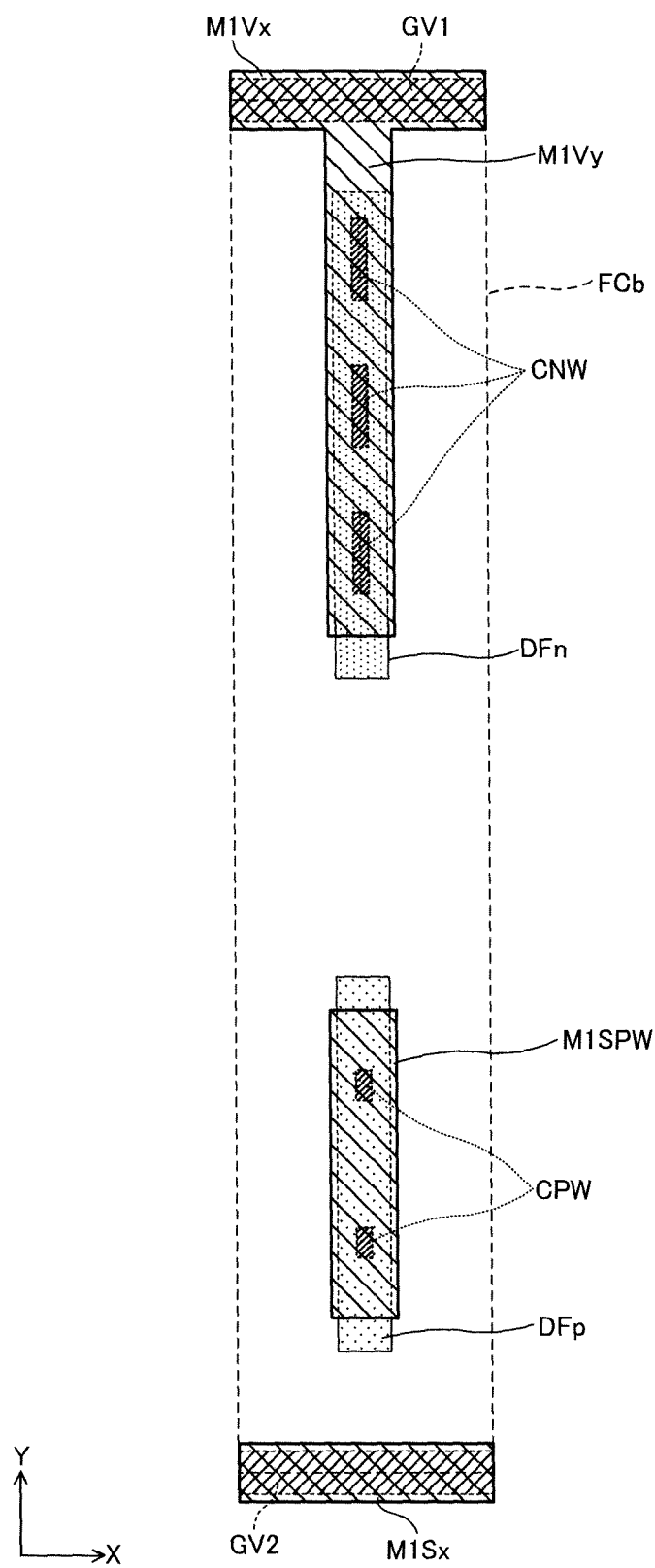
FIG. 17 is a perspective plan view showing a layout pattern of a feed cell FCb according to a modification.
Figure 18:
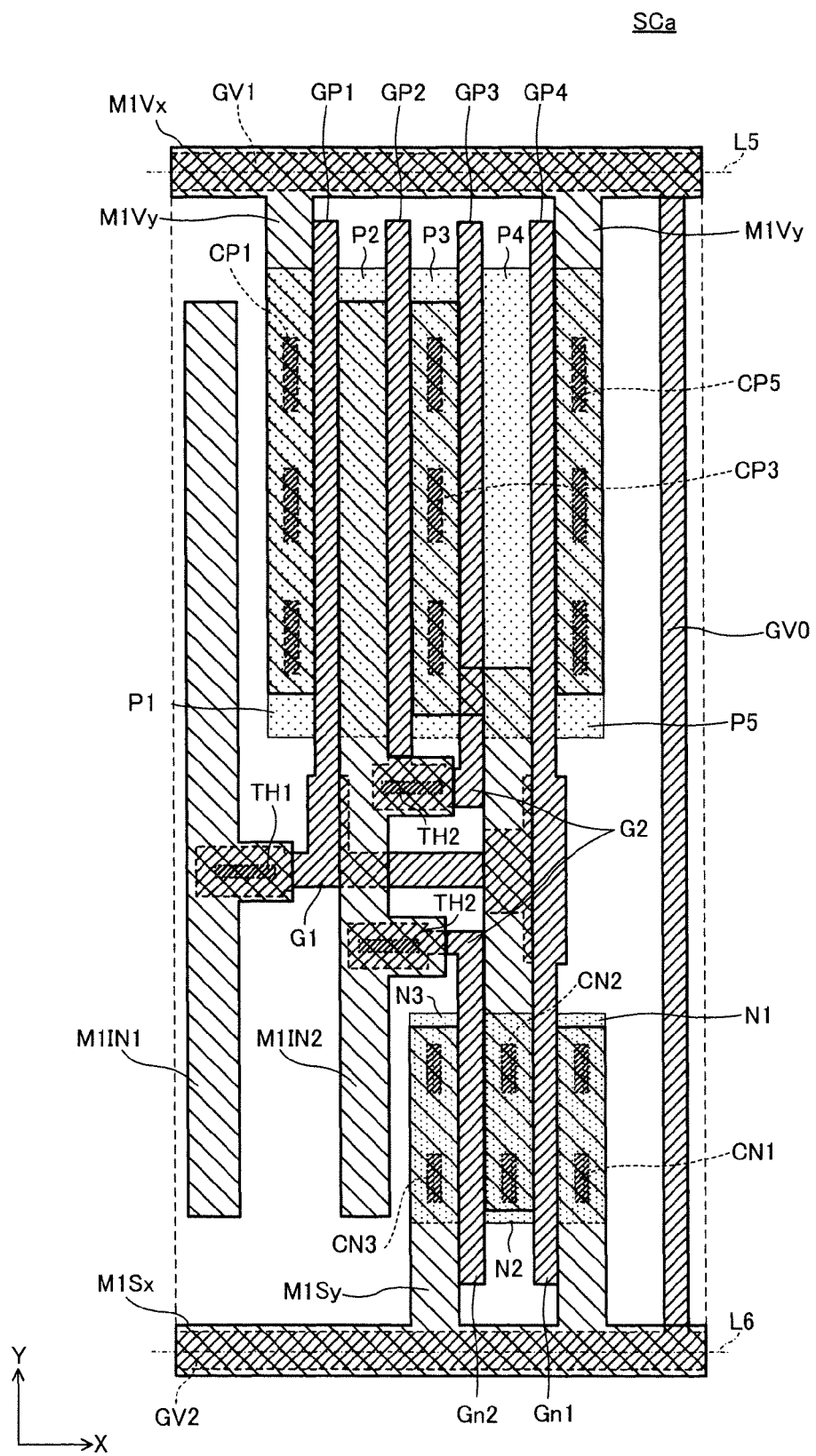
FIG. 18 is a perspective plan view showing a layout pattern of a standard cell SCa according to a modification.

As shown in FIG. 17, in contrast to the example shown in FIG. 16, a feed cell FCb including the feeding diffusion regions DFp and DFn and the contact conductors CNW and CPW without the power supply wiring GV0 extending in the Y direction may be used. When the feed cell FCb shown in FIG. 17 is used, the same cell track CT needs to include at least one cell that includes the power supply wiring GV0 extending in the Y direction (for example, the bypass cell BC). Alternatively, as shown in FIG. 18, some standard cells SCa may include the power supply wiring GV0 so that the power supply wiring GV0 connects the power supply wiring GV1 formed along one end L5 and the power supply wiring GV2 formed along the other end L6.

Since the mesh-like power supply wiring GV is formed on the gate wiring layer G, the power supply wiring GV is preferably arranged to avoid pn junctions and boundaries of diffusion regions having different impurity concentrations so that there is no such junction or boundary directly below or near. The reason is that an unintended MOS transistor can be formed if there is a pn junction or a boundary of diffusion regions directly below or near the power supply wiring GV. The power supply wiring GV is therefore preferably laid out to avoid the feeding diffusion regions DFp and DFn. In the present embodiment, the gate wiring layer G includes a large number of the power supply wirings GV as well as the gate electrodes Gn and Gp. This can cause a higher stress on the power supply wiring GV than heretofore. A layout for easing such a stress is also preferred.

Figure 19:
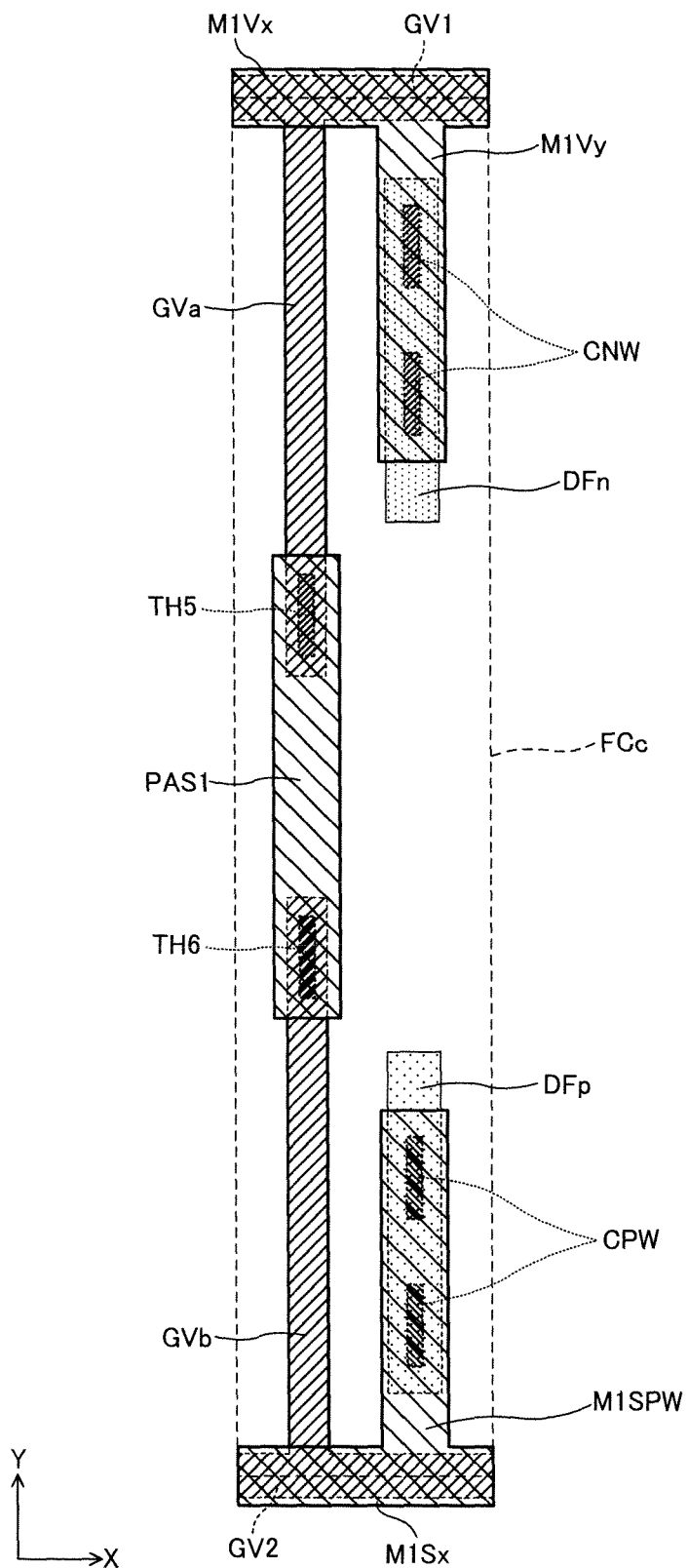
FIG. 19 is a perspective plan view showing a layout pattern of a feed cell FCc according to a first example in which the power supply wiring GV is segmented.

FIG. 19 shows an example of a feed cell FCc in which the power supply wiring GV is segmented at a boundary portion between the n-well region NW and the p-well region PW. The ends of the two segments of power supply wiring GVa and GVb are connected to each other via through hole conductors TH5 and TH6 and connection wiring PAS1 formed on the first wiring layer M1. This configuration ensures the connection in the Y direction. Since the boundary portion between the n-well region NW and the p-well region PW is likely to cause a stress, the power supply wiring GV can be broken by the stress if the power supply wiring GV extends across the boundary portion. The layout shown in FIG. 19 can be used to avoid such a break.

Figure 20:
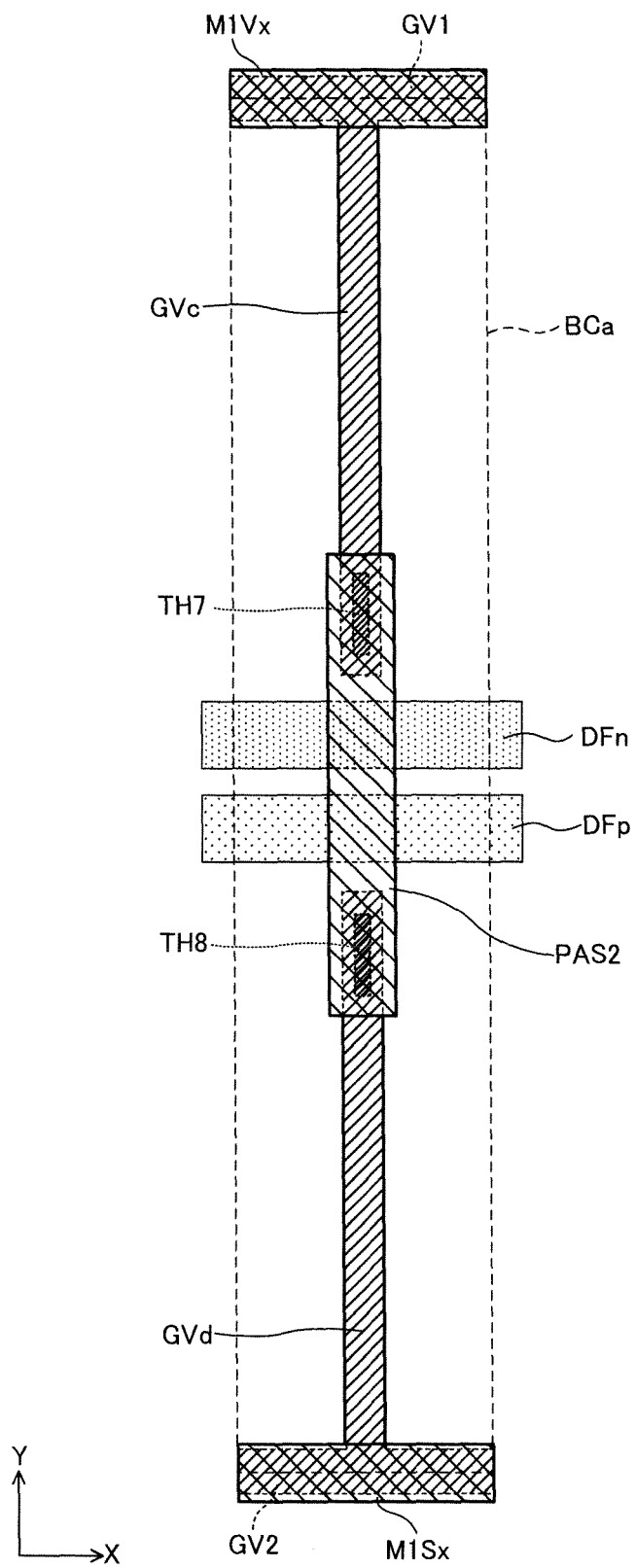
FIG. 20 is a perspective plan view showing a layout pattern of a feed cell FCc according to a second example in which the power supply wiring GV is segmented.

FIG. 20 shows an example of a bypass cell BCa in which the power supply wiring GV is segmented to avoid the diffusion region DFn formed in the n-well region NW and the diffusion region DFp formed in the p-well region PW. The ends of the two segments of power supply wiring GVc and GVd are connected to each other via through hole conductors TH7 and TH8 and connection wiring PAS2 formed on the first wiring layer M1. This configuration ensures the connection in the Y direction. Such the configuration prevents the formation of a parasitic transistor with the diffusion regions DFn and DFp as the channel and the n-well region NW and the p-well region PW as the source and drain. The present example also eases the stress on the gate wiring layer G.

Figure 21:
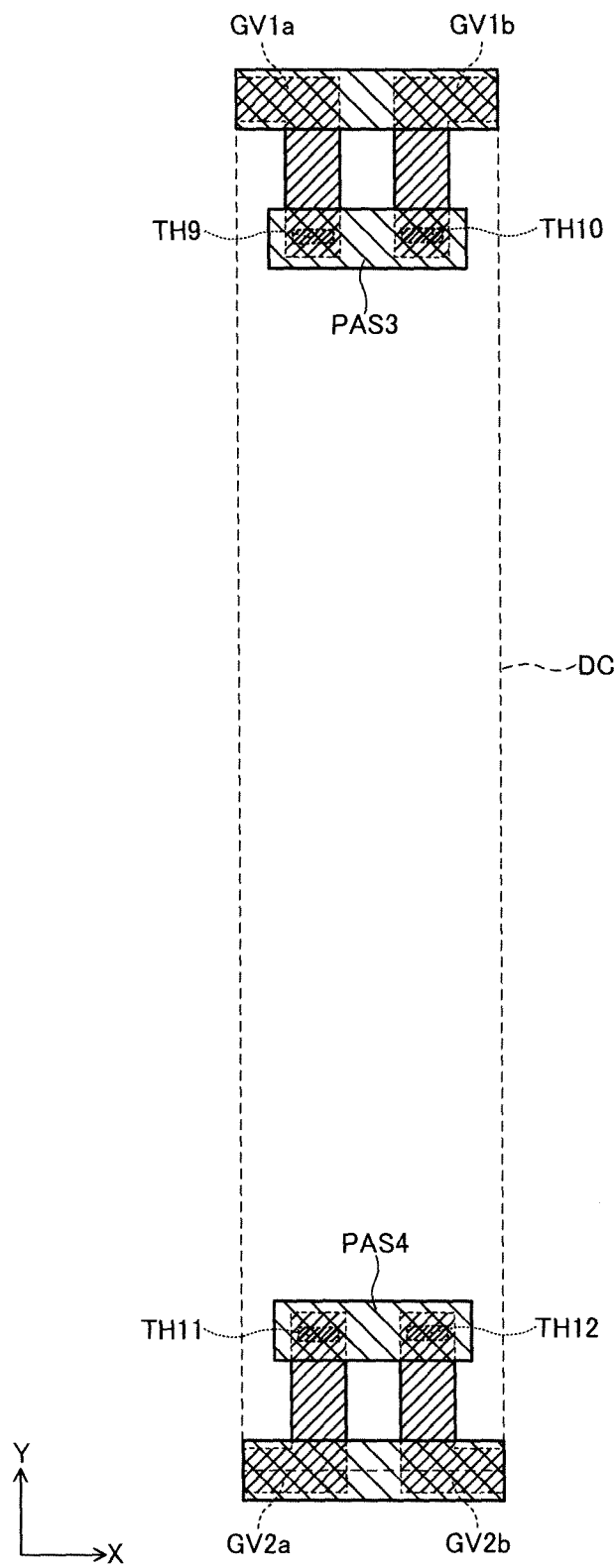
FIG. 21 is a perspective plan view showing a layout pattern of a dummy cell DC according to a third example in which the power supply wiring GV is segmented.

FIG. 21 shows an example of a dummy cell DC in which the power supply wiring GV1 and GV2 extending in the X direction is segmented. The ends of the two segments of power supply wiring GV1a and GV1b are connected to each other via through hole conductors TH9 and TH10 and connection wiring PAS3 formed on the first wiring layer M1. This configuration ensures the connection in the X direction. Similarly, the ends of the two segments of power supply wiring GV2a and GV2b are connected to each other via through hole conductors TH11 and TH12 and connection wiring PAS4 formed on the first wiring layer M1. This configuration ensures the connection in the X direction. Such the configurations ease the stress on the gate wiring layer G. In the example shown in FIG. 21, the power supply wirings GV1 and GV2 are bent toward the inside of the dummy cell DC and connected through the connection wiring PAS3 and PAS4 inside the dummy cell DC, whereas such a configuration is not indispensable.

As has been described above, the semiconductor device according to the present embodiment includes the mesh-like power supply wiring GV that is formed by using the gate wiring layer G. And the well potential VPW is supplied to the p-well regions PW through the mesh-like power supply wiring GV. Consequently, the power supply wiring M2SPW for supplying the well potential VPW need not be formed for each p-well region PW, and at least one power supply wiring M2SPW has only to be provided for the plurality of p-well regions PW. This can reduce the wiring density of the wiring formed on the second wiring layer M2. The semiconductor device according to the present embodiment is therefore suited to a situation where a well potential different from the operating potentials supplied to the sources of the MOS transistors is supplied to well regions.

However, in the present invention, the well potentials of the well regions need not necessarily differ from the operating potentials of the MOS transistors. The potentials may be the same. Next, an embodiment according to an example where the well potentials of the well regions are the same as the operating potentials of the MOS transistors will be described.

Figure 22:
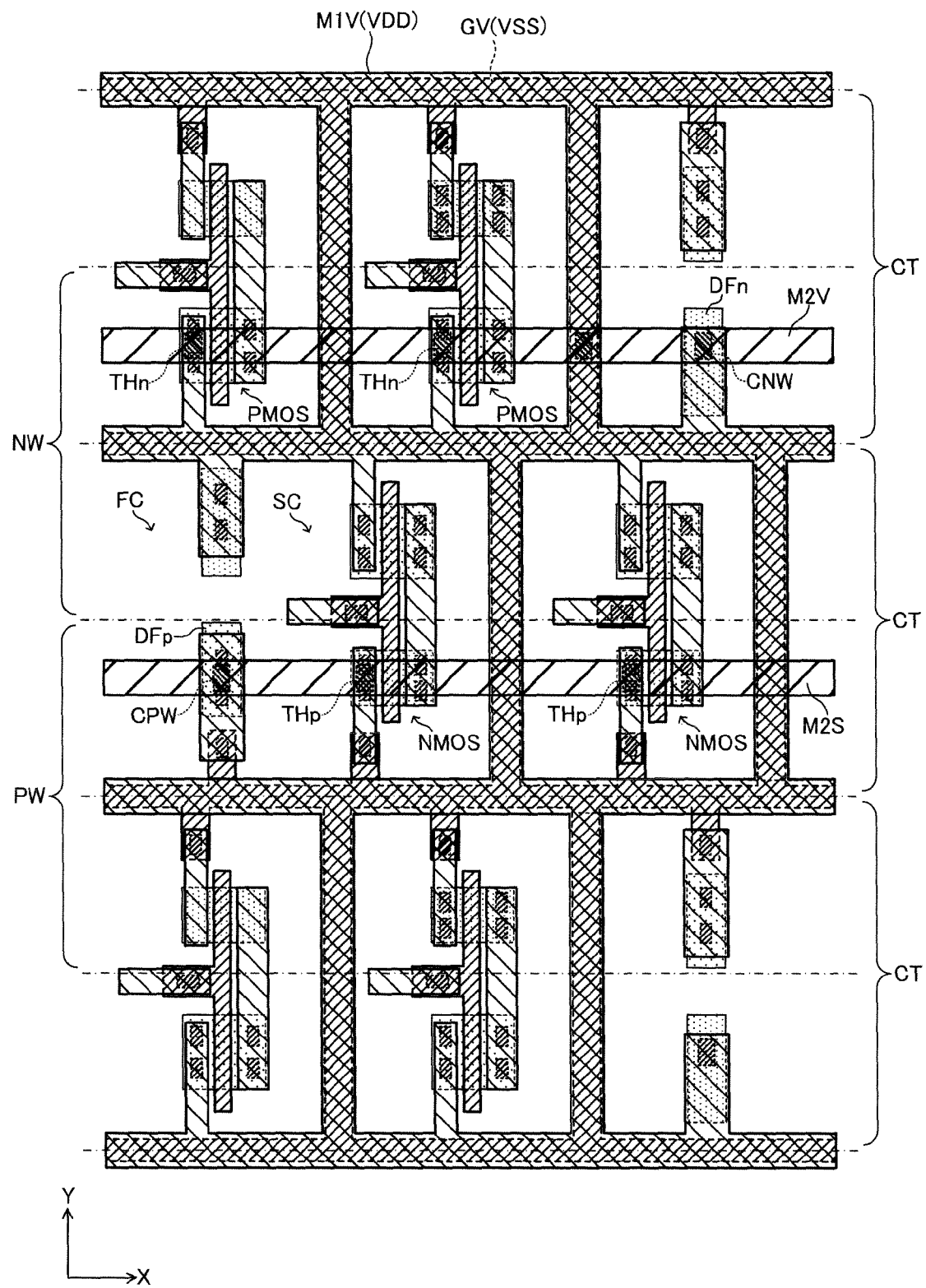
FIG. 22 is a perspective plan view showing the configuration of essential parts of a semiconductor device according to a preferred second embodiment of the present invention.

Turning to FIG. 22, in the second embodiment of the present invention, the mesh-like power supply wiring GV formed on the gate wiring layer G is supplied with the low-level power supply potential VSS. Mesh-like power supply wiring M1V formed on the first wiring layer M1 is supplied with the high-level power supply potential VDD. The low-level power supply potential VSS is also used as the well potential of the p-well regions PW. The high-level power supply potential VDD is also used as the well potential of the n-well regions NW. Therefore, the number of the power supply potentials used in the present embodiment is two. The power supply potentials VSS and VDD are supplied from power supply wiring M2S and M2V formed on the second wiring layer M2, respectively.

The power supply wiring M2S is wiring extending in the X direction. The power supply wiring M2S is connected to a diffusion region DFp formed in the p-well region PW through a contact conductor CPW, and is connected to the mesh-like power supply wiring GV via through hole conductors THp. As a result, the low-level power supply potential VSS is supplied to the diffusion regions DFp formed in the p-well regions PW and to the sources of the N-channel MOS transistors NMOS formed in the p-well regions PW.

The power supply wiring M2V is also wiring extending in the X direction. The power supply wiring M2V is connected to a diffusion region DFn formed in the n-well area NW through a contact conductor CNW, and is connected to the mesh-like power supply wiring M1V via through hole conductors THn. As a result, the high-level power supply potential VDD is supplied to the diffusion regions DFn formed in the n-well regions NW and to the sources of the P-channel MOS transistors MPS formed in the n-well regions NW.

Even in the example of FIG. 22, the semiconductor device includes a plurality of cell tracks CT. Each cell track CT includes a plurality of standard cells SC and feed cells FC which are arranged in the X direction. In that respect, the present embodiment is the same as the foregoing first embodiment. In the present embodiment, the mesh-like power supply wiring GV is supplied with the power supply potential VSS, and the mesh-like power supply wiring M1V is supplied with the power supply potential VDD. A single power supply wiring M2S and a single power supply wiring M2V can thus be allocated for the plurality of cell tracks CT. This can reduce the wiring density of the wirings formed on the second wiring layer M2.

In the present embodiment, the power supply wiring GV of the gate wiring layer G forms a mesh of the power supply potential VSS. The gate wiring layer G therefore preferably has a wiring resistance as low as possible. A gate wiring layer G is typically made of doped polysilicon, which has a wiring resistance higher than that of metal material used for the upper wiring layers. In the present embodiment, the gate wiring layer G is thus preferably made of metal material.

As described above, in the present embodiment, the gate wiring layer G is used to form a mesh of the power supply potential VSS, and the first wiring layer M1 is used to form a mesh of the power supply potential VDD. Power supply meshes to be formed on the wiring layers above the first wiring layer M1 can thus be simplified or even omitted in some cases. This significantly reduces the number of the power supply wirings to be formed on the wiring layers above the first wiring layer M1, so that a greater number of signal wirings can be allocated accordingly.

As describe above, in the first and second embodiments, a power supply mesh is formed by using the gate wiring layer G. However, this is not indispensable to the present invention. Next, an embodiment according to an example where a power supply mesh is formed by using a plurality of wiring layers including the gate wiring layer G will be described.

Figure 23:
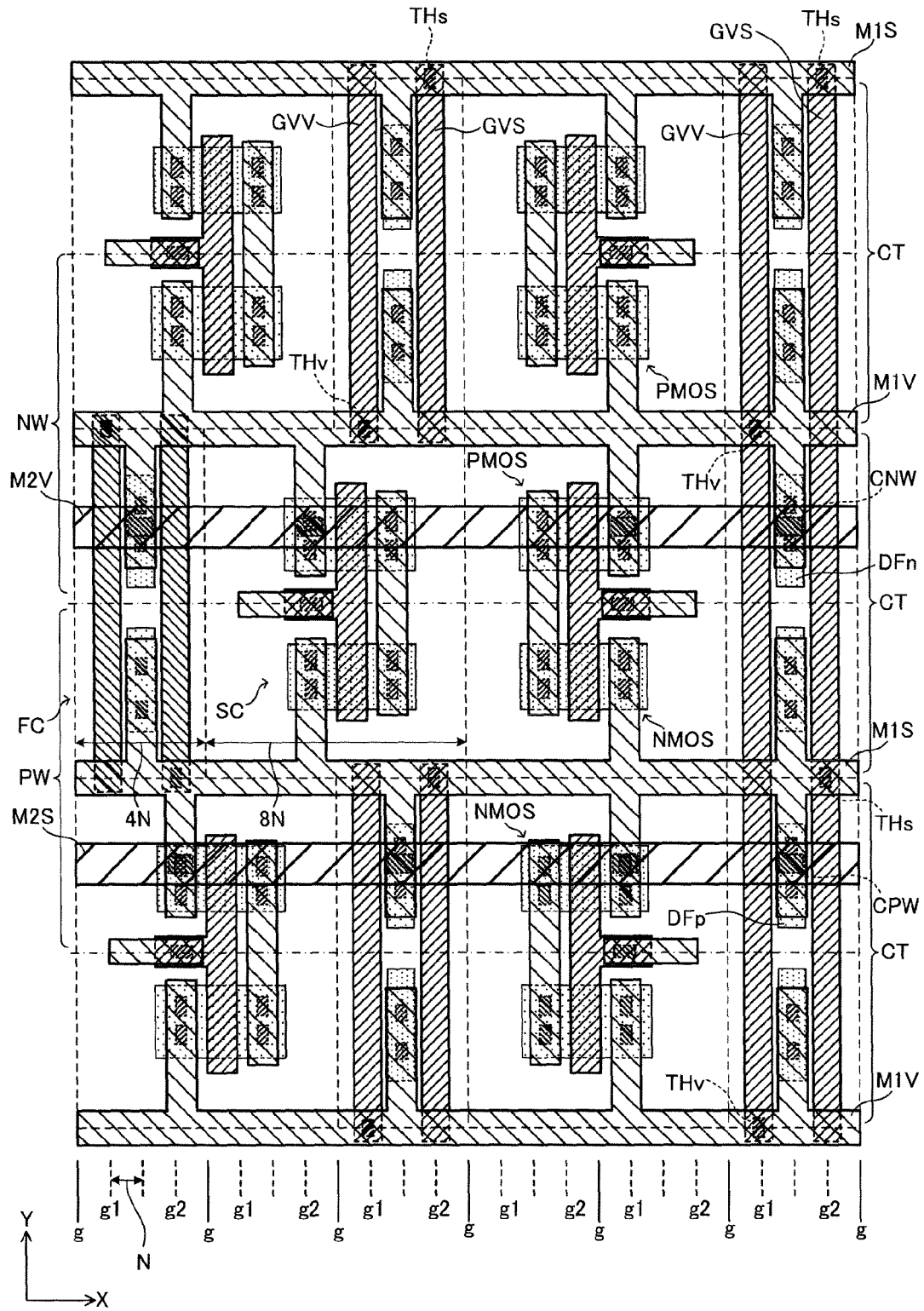
FIG. 23 is a perspective plan view showing the configuration of essential parts of a semiconductor device according to a preferred third embodiment of the present invention.

Turning to FIG. 23, in the third embodiment of the present invention, power supply wiring GVV and GVS formed on the gate wiring layer G extends mainly in the Y direction. Power supply wiring M1V and M1S formed on the first wiring layer M1 extends mainly in the X direction. The power supply wirings GVV and GVS on the gate wiring layer G are arranged in feed cells FC in parallel. The power supply wiring GVV and the power supply wiring M1V are connected via through conductors THv. The power supply wiring GVS and the power supply wiring M1S are connected via through hole conductors THs. Consequently, there are formed two power supply meshes. The power supply potential VDD is supplied to the power supply wiring M1V through a power supply wiring M2V which extends in the X direction on the second wiring layer M2. Similarly, the power supply potential VSS is supplied to the power supply wiring M1S through a power supply wiring M2S which extends in the X direction on the second wiring layer M2.

The power supply wiring M1S formed on the first wiring layer M1 is connected to the diffusion regions DFp formed in the p-well regions PW through contact conductors CPW, and is supplied to the sources of the N-channel MOS transistors NMOS formed in the p-well regions PW. The power supply wiring M1V formed on the first wiring layer M1 is connected to the diffusion regions DFn formed in the n-well regions NW through contact conductors CNW, and is supplied to the sources of the P-channel MOS transistors PMOS formed in the n-well regions NW.

Even in the example shown in FIG. 23, the semiconductor device includes a plurality of cell tracks CT. Each cell track CT includes a plurality of standard cells SC and feed cells FC which are arranged in the X direction. In that respect, the present embodiment is the same as the foregoing first and second embodiments. Like the first and second embodiments, a single power supply wiring M2S and a single power supply wiring M2V can thus be allocated for the plurality of cell tracks CT. This can reduce the wiring density of the wiring formed on the second wiring layer M2.

Also, in the present embodiment, the power supply wiring GVV formed on the gate wiring layer G and the power supply wiring M1V formed on the first wiring layer M1 are used to construct the mesh-like VDD wiring in a three-dimensional manner. The power supply wiring GVS formed on the gate wiring layer G and the power supply wiring M1S formed on the first wiring layer M1 are used to construct the mesh-like VSS wiring in a three-dimensional manner. Therefore, even if the gate wiring layer G and the first wiring layer M1 have a large difference in the wiring resistance, the two mesh-like power supply wirings have little difference in the wiring resistance.

Each cell in the cell tracks CT is arranged with reference to predetermined grids. If N is the minimum unit of the grids, the length of each cell in the X direction is expressed as 4Na, where a is a natural number. FIG. 23 shows an example where the feed cells FC have a length of 4N in the X direction and the standard cells SC have a length of 8N in the X direction. The ends of the cells in the X direction are conditioned to be laid out along grids g shown in FIG. 23. The grids g refer to grids that extend in the Y direction and appear at every 4N.

If such a condition is satisfied, the power supply wiring GV are formed on the gate wiring layer G along grids g1 and g2 in the feed cells FC. The grids g1 refer to grids that extend in the Y direction and appear at every 4N, with a shift of N in the X direction with respect to the grids g. The grids g2 refer to grids that extend in the Y direction and appear at every 4N, with a shift of 3N in the X direction with respect to the grids g. The through hole conductors THv are arranged at intersections between the power supply wiring M1V extending in the X direction and grids g1. The through hole conductors THs are arranged at intersections between the power supply wiring M1S and grids g2. Such an arrangement can form the foregoing two three-dimensional mesh-like power supply wirings.

Next, a design apparatus and a method for designing a semiconductor device according to a preferred embodiment of the present invention will be described.

Figure 24:
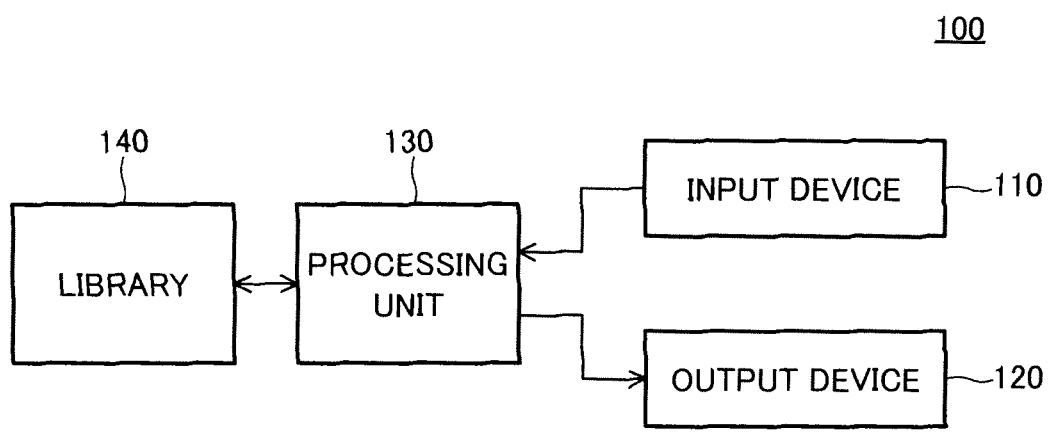
FIG. 24 is a block diagram showing a design apparatus 100 for designing a semiconductor device according to the present embodiment.

Turning to FIG. 24, the design apparatus 100 includes an input device 110, an output device 120, a processing unit 130 which is connected to the devices 110 and 120, and a library 140 in which the layout of a plurality of standard cells SC and feed cells FC is registered. The design apparatus 100 can thus be constituted by using a typical computer that runs on a program. When circuit data on a circuit block to be designed is input through the input device 110, the design apparatus 100 outputs corresponding layout pattern data from the output device 120. The layout pattern data refers to data that describes a physical device configuration for implementing the circuit block. The layout pattern data includes position data and shape data about diffusion layers, gate electrodes, signal wirings, power supply wirings, contact conductors, and through hole conductors.

Figure 25:
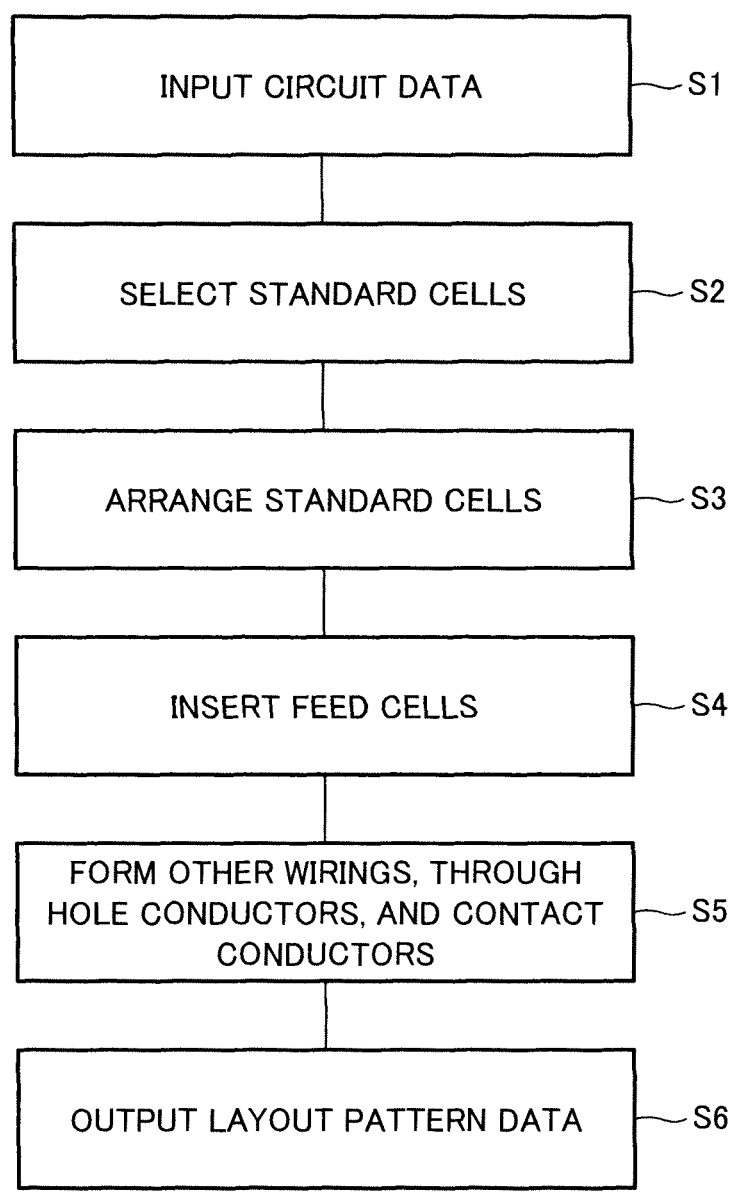
FIG. 25 is a flowchart for explaining the method for designing a semiconductor device according to the present embodiment.

As shown in FIG. 25, circuit data on a circuit block to be designed is initially input through the input device 110 (step S1). The input circuit data is supplied to the processing unit 130. The processing unit 130 analyzes the circuit data, and identifies a plurality of standard cells SC needed and a combination thereof from among a large number of standard cells SC registered in the library 140 (step S2). Next, the processing unit 130 arranges the selected plurality of standard cells SC into a plurality of cell tracks CT (step S3). Each standard cell SC includes power supply wiring GV along the boundaries of the cell track CT, whereby a plurality of power supply wirings GV each extending in the X direction are formed. It will be understood that such processing is information processing executed inside the design apparatus 100, and no physical cell is actually arranged on a semiconductor substrate. The processing only includes virtually laying out the standard cells SC in the virtual cell tracks CT defined in the design apparatus 100. The same applies for the following processing.

Next, the processing unit 130 inserts at least one feed cell FC into each cell track CT (step S4). This fixes the layout of the cells constituting the circuit block. The plurality of power supply wirings GV each extending in the X direction are short-circuited by power supply wirings GV that are formed in the feed cells FC and extend in the Y direction. This forms a mesh-like configuration.

The processing unit 130 then generates needed wirings on the first wiring layer M1, the second wiring layer M2, and the third wiring layer M3 in order, and generates needed through hole conductors and contact conductors to complete the layout pattern data (step S5). The generated layout pattern data is output from the output device 120 (step S6). A series of processing is thus completed.

Figure 26:
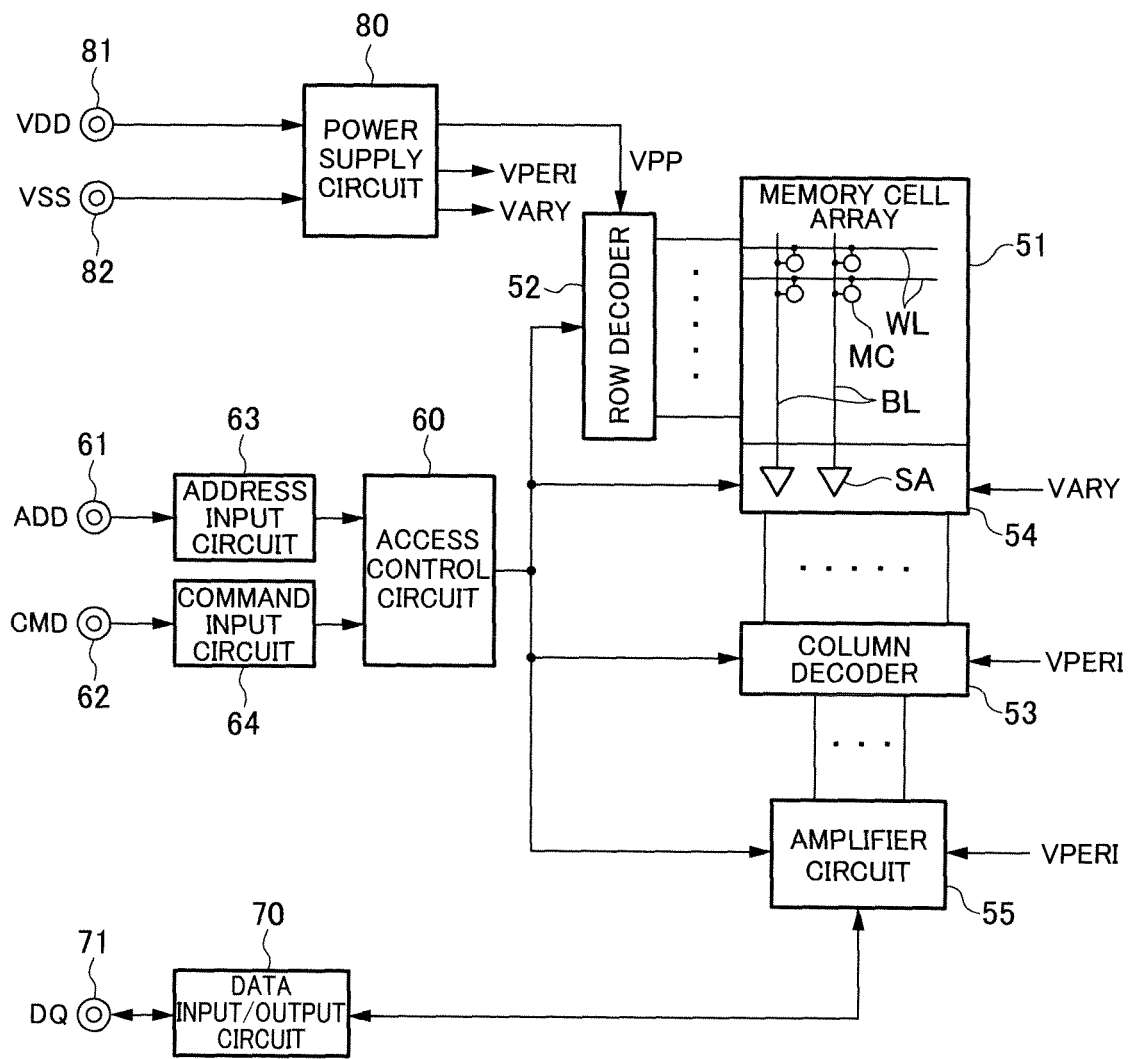
FIG. 26 is a block diagram showing the overall configuration of a semiconductor device 50 according to a preferred embodiment of the present invention.

Turning to FIG. 26, a specific circuit configuration of a semiconductor device to which the present invention can be applied will be described.

The semiconductor device 50 according to the present embodiment is a DRAM, and includes a memory cell array 51 as shown in FIG. 26. The memory cell array 51 includes a plurality of word lines WL and a plurality of bit lines BL which intersect each other. Memory cells MC are arranged at the intersections. The word lines WL are selected by a row decoder 52. The bit lines EL are selected by a column decoder 53. The bit lines BL are connected to respective corresponding sense amplifiers SA in a sense circuit 54. The bit lines BL selected by the column decoder 53 are connected to an amplifier circuit 55 through the sense amplifiers SA.

The operation of the row decoder 52, the column decoder 53, the sense circuit 54, and the amplifier circuit 55 is controlled by an access control circuit 60. An address signal ADD is supplied from outside to the access control circuit 60 through an address terminal 61 and an address input circuit 63. A command signal CMD is supplied from outside to the access control circuit 60 through a command terminal 62 and a command input circuit 64. The address input circuit 63 functions to receive and amplify the address signal ADD supplied to the address terminal 61. Similarly, the command input circuit 64 functions to receive and amplify the command signal CMD supplied to the command terminal 62. The access control circuit 60 receives the address signal ADD and the command signal CMD, and controls the row decoder 52, the column decoder 53, the sense circuit 54, and the amplifier circuit 55 based on the address signal ADD and the command signal CMD.

Specifically, if the command signal CMD indicates an active operation of the semiconductor device 50, the address signal ADD is supplied to the row decoder 52. The row decoder 52, in response, selects a word line WL indicated by the address signal ADD, whereby corresponding memory cells MC are connected to the respective bit lines BL. The access control circuit 60 then activates the sense circuit 54 at predetermined timing.

If the command signal CMD indicates a read operation or a write operation of the semiconductor device 50, the address signal ADD is supplied to the column decoder 53. The column decoder 53, in response, connects bit lines BL indicated by the address signal ADD to the amplifier circuit 55. In a read operation, read data DQ read from the memory cell array 51 through the sense amplifiers SA is thereby output from a data terminal 71 to outside through the amplifier circuit 55 and a data input/output circuit 70. In a write operation, write data DQ supplied from outside through the data terminal 71 and the data input/output circuit 70 is written into the memory cells MC through the amplifier circuit 55 and the sense amplifiers SA.

Such circuit blocks use respective predetermined internal voltages as their operating power supply. The internal voltages are generated by a power supply circuit 80 shown in FIG. 26. The power supply circuit 80 receives an external potential VDD and a ground potential VSS supplied through power supply terminals 81 and 82, respectively. Based on the potentials, the power supply circuit 80 generates internal voltages VPP, VPERI, VARY, etc. The internal voltage VPP is generated by boosting the external potential VDD. The internal voltages VPERI and VARY are generated by stepping down the external potential VDD.

The internal voltage VPP is a voltage that is mainly used in the row decoder 52. The row decoder 52 drives the word line WL selected based on the address signal to the VPP level, thereby making the cell transistors included in the memory cells MC conducting. The internal voltage VARY is a voltage that is mainly used in the sense circuit 54. The sense circuit 54, when activated, drives either one of each pair of bit lines to the VARY level and the other to the VSS level, thereby amplifying read data that is read out. The internal voltage VPERI is used as the operating voltage of most of the peripheral circuits including the access control circuit 60. Since the internal voltage VPERI lower than the power supply voltage VDD supplied from outside is used as the operating voltage of the peripheral circuits, the semiconductor device 50 is reduced in power consumption. While the foregoing standard cells SC are described to use the voltage VDD, the internal voltage VPERI may be used instead.

With the semiconductor device 50 having such a configuration, the present invention may be applied, for example, to circuit blocks included in the access control circuit 60.

It is apparent that the present invention is not limited to the above embodiments, but may be modified and changed without departing from the scope and spirit of the invention.

What is claimed is:

1. A semiconductor device comprising:
   a plurality of first standard cells arranged on a semiconductor substrate in a first direction, each of the first standard cells including at least one field-effect transistor; and
   a first power supply wiring extending in the first direction along one end of the first standard cells,
   the field-effect transistor including a gate electrode formed on a gate wiring layer,
   the first power supply wiring being formed on the gate wiring layer, the gate electrode and the first power supply wiring being formed in the same layer.

2. The semiconductor device as claimed in claim 1, further comprising a second power supply wiring extending in the first direction along the other end of the first standard cells,
   wherein the second power supply wiring is formed on the gate wiring layer.

3. The semiconductor device as claimed in claim 2, further comprising a third power supply wiring extending in a second direction and electrically connecting the first power supply wiring to the second power supply wiring,
   wherein the third power supply wiring is formed on the gate wiring layer.

4. The semiconductor device as claimed in claim 3, further comprising:
   a plurality of second standard cells arranged on the semiconductor substrate in the first direction, each of second standard cells including at least one field-effect transistor; and
   a fourth power supply wiring that extends in the first direction along one end of the second standard cells,
   wherein the fourth power supply wiring is formed on the gate wiring layer.

5. The semiconductor device as claimed in claim 4, wherein the one end of the first standard cells substantially coincides with the other end of the second standard cells.

6. The semiconductor device as claimed in claim 3, wherein
   the semiconductor substrate includes a first well region of a first conductivity type that is common to the first standard cells,
   at least some of the field-effect transistors are formed on the first well region, and
   a predetermined well potential is supplied to the first well region through the first power supply line.

7. The semiconductor device as claimed in claim 6, wherein
   the semiconductor substrate includes a second well region of a second conductivity type opposite to the first conductivity type that is common to the first standard cells, and
   at least some other of the field-effect transistors are formed on the second well region.

8. The semiconductor device as claimed in claim 6, further comprising a feed cell interposed between two of the first standard cells, wherein the third power supply wiring is arranged on the feed cell.

9. The semiconductor device as claimed in claim 8, wherein
the first well region includes a feeding diffusion region to which the well potential is supplied, and
the feed cell includes a first contact conductor that supplies the well potential to the diffusion region.

10. The semiconductor device as claimed in claim 3, wherein
the third power supply wiring is divided into first and second portions, and
the first portion and the second portion are short-circuited through another wiring layer lying above the gate wiring layer.

11. The semiconductor device as claimed in claim 7, wherein
the third power supply wiring is divided into first and second portions,
one end of the first portion and one end of the second portion are short-circuited through another wiring layer lying above the gate wiring layer, and
a boundary between the first well region and the second well region is formed between the one end of the first portion and the one end of the second portion.

12. The semiconductor device as claimed in claim 9, wherein
the third power supply wiring is divided into first and second portions,
one end of the first portion and one end of the second portion are short-circuited through another wiring layer lying above the gate wiring layer, and
the diffusion region is formed between the one end of the first portion and the one end of the second portion.

13. The semiconductor device as claimed in claim 1, wherein
the first power supply wiring is divided into third and fourth portions, and
the third portion and the fourth portion are short-circuited through another wiring layer lying above the gate wiring layer.

14. The semiconductor device as claimed in claim 3, further comprising a fifth power supply wiring formed on a first wiring layer lying above the gate wiring layer,
wherein the first to third power supply wirings and the fifth power supply wiring are supplied with different power supply potentials from each other.

15. The semiconductor device as claimed in claim 14, further comprising a sixth power supply wiring and a seventh power supply wiring that are formed on a second wiring layer lying above the first wiring layer, wherein
the sixth power supply wiring and the seventh power supply wiring extend in the first direction,
the sixth power supply wiring is electrically connected to the first to third power supply wirings through a second contact conductor, and
the seventh power supply wiring is electrically connected to the fifth power supply wiring through a third contact conductor.

16. The semiconductor device as claimed in claim 2, further comprising an eighth power supply wiring and a ninth power supply wiring that are formed on a first wiring layer lying above the gate wiring layer and extend in the second direction, wherein
the eighth power supply wiring is electrically connected to the first power supply wiring through a fourth contact conductor, and
the ninth power supply wiring is electrically connected to the second power supply wiring through a fifth contact conductor.

17. The semiconductor device as claimed in claim 16, further comprising a tenth power supply wiring and an eleventh power supply wiring that are formed on a second wiring layer lying above the first wiring layer, wherein
the tenth power supply wiring and the eleventh power supply wiring extend in the second direction,
the tenth power supply wiring is electrically connected to the eighth power supply wiring through a sixth contact conductor, and
the eleventh power supply wiring is electrically connected to the ninth power supply wiring through a seventh contact conductor.

18. A semiconductor device comprising:
a first power supply wiring extending in a first direction and formed on a first wiring layer;
a second power supply wiring extending in the first direction and formed on the first wiring layer, the second power supply wiring being provided independently of the first power supply wiring; and
a third power supply wiring extending in a second direction different from the first direction and formed on a gate wiring layer on which a gate wiring of a transistor is formed, the third power supply wiring and the gate wiring being formed in the same layer, the third power supply wiring electrically connecting the first power supply wiring to the second power supply wiring.

19. The semiconductor device as claimed in claim 18, wherein the first to third power supply wirings are formed on a cell rack on which a plurality of standard cells are arranged.

20. The semiconductor device as claimed in claim 18, wherein the first to third power supply wirings are formed in a standard cell.

21. The semiconductor device as claimed in claim 18, wherein the first wiring layer is the gate wiring layer.

22. The semiconductor device as claimed in claim 18, wherein the first wiring layer is provided above the gate wiring layer.

\* \* \* \* \*